US012672321B2

(12) United States Patent
Lu

(10) Patent No.: US 12,672,321 B2
(45) Date of Patent: Jun. 30, 2026

(54) METAL-OXIDE-SEMICONDUCTOR FIELD-EFFECT TRANSISTOR STRUCTURE WITH LOW LEAKAGE CURRENT AND RESERVED GATE LENGTH

(71) Applicant: Invention And Collaboration Laboratory Pte. Ltd., Singapore (SG)

(72) Inventor: Chao-Chun Lu, Taipei City (TW)

(73) Assignees: Invention And Collaboration Laboratory Pte. Ltd., Singapore (SG); Etron Technology, Inc., Hsinchu (TW)

( * ) Notice: Subject to any disclaimer, the term of this patent is extended or adjusted under 35 U.S.C. 154(b) by 457 days.

(21) Appl. No.: 18/207,149

(22) Filed: Jun. 8, 2023

(65) Prior Publication Data

US 2023/0402504 A1     Dec. 14, 2023

Related U.S. Application Data

(60) Provisional application No. 63/350,458, filed on Jun. 9, 2022.

(51) Int. Cl.
H10D 62/10        (2025.01)
H10D 30/60        (2025.01)
                (Continued)

(52) U.S. Cl.
CPC ......... H10D 62/102 (2025.01); H10D 30/601 (2025.01); H10D 62/371 (2025.01);
                (Continued)

(58) Field of Classification Search
CPC .. H10D 62/102; H10D 30/601; H10D 62/371;

H10D 64/514; H10D 64/518; H10D 84/85; H10D 84/0188; H10D 84/038; H10D 30/797; H10D 30/0225; H10D 30/0278; H10D 62/021; H10D 64/021; H10D 62/822; H10D 62/235; H10D 62/307; H10D 64/663; H10D 62/116; H10D 62/405; H10D 84/854; H10D 84/017

See application file for complete search history.

(56) References Cited

U.S. PATENT DOCUMENTS 6,071,783 A *  6/2000  Liang ................... H10D 62/021
                                                438/300
9,136,329 B2 *  9/2015  Huang ................... H10D 30/60
                        (Continued)

*Primary Examiner* — Steven B Gauthier
*Assistant Examiner* — Khatib A Rahman
(74) *Attorney, Agent, or Firm* — Winston Hsu

(57)                ABSTRACT

A metal-oxide-semiconductor field-effect transistor (MOSFET) structure includes a semiconductor substrate, a gate structure, a channel region, a trench, an isolation region, a first conductive region, and a P-N junction. The semiconductor substrate has a semiconductor surface. The gate structure is above the semiconductor surface. The channel region is under the gate structure. The trench is formed below the semiconductor surface and adjacent to the channel region. The isolation region is in the trench. The first conductive region has a first doping type, and the first conductive region is positioned on the isolating layer and electrically coupled to the channel region. The P-N junction extends upward from the isolation region and along an edge of the first conductive region.

20 Claims, 23 Drawing Sheets
(2 of 23 Drawing Sheet(s) Filed in Color)

(51) Int. Cl.
| | | |
|---|---|---|
| *H10D 62/17* | (2025.01) | |
| *H10D 64/27* | (2025.01) | |
| *H10D 84/01* | (2026.01) | |
| *H10D 84/03* | (2025.01) | |
| *H10D 84/85* | (2025.01) | |

(52) U.S. Cl.
CPC ......... *H10D 64/514* (2025.01); *H10D 64/518* (2025.01); *H10D 84/85* (2025.01); *H10D 84/0188* (2025.01); *H10D 84/038* (2025.01)

(56) References Cited

U.S. PATENT DOCUMENTS

| | | | | |
|---|---|---|---|---|
| 2004/0173855 A1* | 9/2004 | Masuoka | ........... | H10D 30/0227 257/E21.336 |
| 2005/0173735 A1* | 8/2005 | Li | ......................... | H10D 64/017 257/E21.345 |
| 2005/0176205 A1* | 8/2005 | Chien | .................. | H10D 30/608 257/E29.267 |
| 2006/0131657 A1* | 6/2006 | Hamaguchi | .......... | H10D 62/151 257/296 |
| 2007/0108508 A1* | 5/2007 | Lin | .................... | G11C 16/0466 257/E21.21 |
| 2007/0267703 A1* | 11/2007 | Chong | ............... | H10D 30/0275 257/E21.431 |
| 2008/0128746 A1* | 6/2008 | Wang | .................. | H10D 30/797 257/190 |
| 2008/0258185 A1* | 10/2008 | Huang | ............... | H10D 30/0278 257/288 |
| 2009/0124056 A1* | 5/2009 | Chen | .................. | H10D 30/0275 438/278 |
| 2014/0061925 A1* | 3/2014 | Kim | .................. | H01L 21/28088 438/589 |

* cited by examiner (a)

(b)

(a)

(b)

(a)

(b)

(a)

(b)

(a)

(b)

(a)

(b)

(a)

(b)

(a)

(b)

$504 \begin{cases} 5041 \\ 5042 \\ 5044 \end{cases}$ $506 \begin{cases} 5062 \\ 5064 \end{cases}$ $1002 \begin{cases} 10022 \\ 10024 \end{cases}$ (a)

METAL-OXIDE-SEMICONDUCTOR FIELD-EFFECT TRANSISTOR STRUCTURE WITH LOW LEAKAGE CURRENT AND RESERVED GATE LENGTH

CROSS REFERENCE TO RELATED APPLICATIONS

This application claims the benefit of U.S. Provisional Application No. 63/350,458, filed on Jun. 9, 2022. The content of the application is incorporated herein by reference.

BACKGROUND OF THE INVENTION

1. Field of the Invention

The present invention relates to a MOSFET (metal-oxide-semiconductor field-effect transistor) structure, and particularly to a MOSFET structure with a vertical screening layer, wherein the vertical screening layer is capable to block leakage current and to reduce the possibility of punch through effect.

2. Description of the Prior Art

The success of low power integrated circuits (ICs) industry is primarily due to the complementary metal-oxide-semiconductor (CMOS) technology, wherein the key role of integrated circuits is the metal-oxide-semiconductor field-effect transistor (MOSFET). Although advanced technology nodes (such as 3-10 nm) for Fin structure transistors are frequently used in high performance computing applications (such as artificial intelligence (AI), central processing unit (CPU), graphics processing unit (GPU), etc.), the mature technology nodes (such as 12-30 nm) for planar MOSFET are still popular in many IC applications (such as power management IC, dynamic random access memory (DRAM), and microcontroller unit (MCU) chip).

FIG. 1 shows a state-of-the-art CMOS which includes a p-type metal-oxide-semiconductor (PMOS) transistor and an n-type metal-oxide-semiconductor (NMOS) transistor. The transistor gate structure using some conductive material (like metal, polysilicon or polyside, etc.) over an insulator (such as oxide, oxide/nitride or some high-k dielectric etc.) is formed on a top of a silicon surface, and the CMOS is isolated from those of other transistors by using insulation materials (e.g. oxide, oxide/nitride or other dielectrics). For an NMOS transistor, there are source and drain regions which are formed by an ion-implantation plus thermal annealing technique to implant n-type dopants into a p-type substrate (or a p-well) which thus results in two separated n+/p junction areas. For a PMOS transistor, both source and drain regions are formed by ion-implantation p-type dopants into an n-well which thus results in two separated n+/p junction areas.

However, during the previously mentioned thermal annealing process, the implanted n-type or p-type dopants will unavoidably diffuse into different directions and enlarge the area of the source and drain regions. The larger the area of the source and drain regions due to the thermal annealing process, the shorter of the effective channel length between the source region and the drain region, and such reduced effective channel length (Leff) will incur short channel effect (SCE). A MOS transistor could be considered to be shorted when the Leff is comparable to the source/drain junction depletion width. When the Leff is further reduced, the drain current finally cannot be turned off and the gate has no control over the charge. The so-called punch-through effect poses a severe problem for miniaturized devices. Therefore, to reduce the impact of SCE, it is common to reserve longer gate length to accommodate the diffusion of n-type or p-type dopants due to thermal annealing. Using technology nodes of 25 nm (Lambda or A) as an example, the reserved length would be 60-100 nm. Thus, the size of the transistor could not be proportionally shrunk.

Other problems are introduced or getting worse in current planar MOSFETs made by mature technology nodes of 12-30 nm: (1) all junction leakages resulted by junction formation processes such as forming lightly doped drain (LDD) into the substrate/well regions, n+ source/drain regions into p-substrate, and p+ source/drain regions into n-well are getting worse to control since leakage currents occur through both perimeter and bottom areas where extra damages like vacant traps for holes and electrons are harder to be reconciled due to lattice imperfections which have been created by ion-implantation; (2) in addition, since the ion-implantation to form the LDD (or the n+/p junction in NMOS or the p+/n junction in PMOS) works like bombardments in order to insert ions from the top of the silicon surface straight down to the substrate, it is hard to create uniform material interfaces with lower defects from the source and drain regions to the channel and the substrate-body regions since the dopant concentrations are non-uniformly distributed vertically from the top surface with higher doping concentrations down to the junction regions with lower doping concentrations; (3) it's getting harder to align the LDD junction edge to the edge of gate structure in a perfect position by only using the conventional self-alignment method of using gate, spacer and ion-implantation formation. In addition, the thermal annealing process for removing the ion-implantation damages must count on high temperature processing techniques such as rapid thermal annealing method by using various energy sources or other thermal processes. One problem thus created is that a gate-induced drain leakage (GIDL) current is badly induced due to a gated diode structure formed in the gate-to-source/drain regions and hard to be controlled regardless the fact that it should be minimized to reduce leakage currents; the other problem as created is that a length of the effective channel is difficult to be controlled and so the short channel effect (SCE) is hardly minimized.

Therefore, the present invention discloses several new concepts of realizing a novel planar transistor structure, which greatly improves or even solves most of the problems as stated above, such as minimizing current leakages, increasing channel-conduction performance and control, optimizing functions of the source and drain regions such as making better their conductance to metal interconnections and their closest physical intact to the channel region with a seamless orderly crystalline lattice matchup.

SUMMARY OF THE INVENTION

An embodiment of the present invention provides a MOSFET (metal-oxide-semiconductor field-effect transistor) structure. The MOSFET structure includes a semiconductor substrate, a gate structure, a channel region, a channel region, a trench, an isolation region, a first conductive region, and a P-N junction. The semiconductor substrate has a semiconductor surface. The gate structure is above the semiconductor surface. The channel region is under the gate structure. The trench is formed below the semiconductor surface and adjacent to the channel region. The isolation region is in the trench. The first conductive region has a first doping type, and the first conductive region is positioned on the isolating layer and electrically coupled to the channel region. The P-N junction extends upward from the isolation region and along an edge of the first conductive region.

According to one aspect of the present invention, the MOSFET structure further includes a vertical screening layer contacting with the first conductive region, wherein a doping type of the vertical screening layer is different from the first doping type of the first conductive region.

According to one aspect of the present invention, both the first conductive region and the vertical screening layer are independent from the semiconductor substrate, and the P-N junction is between the first conductive region and the vertical screening layer.

According to one aspect of the present invention, the MOSFET structure is a planar n-type metal-oxide-semiconductor (NMOS) transistor, the vertical screening layer is a p-type vertical screening layer, the first conductive region includes an n-type lightly doped drain (LDD) region contacting with the p-type vertical screening layer and an n-type heavily doped region contacting with the n-type lightly doped drain (LDD) region.

According to one aspect of the present invention, a doping concentration of the p-type vertical screening layer is the same or substantially the same as that of the channel region.

According to one aspect of the present invention, an edge of the n-type lightly doped drain (LDD) region is aligned or substantially aligned with an edge of the gate structure.

According to one aspect of the present invention, the first conductive region includes a metal containing region, and the metal containing region is positioned in the trench and abuts against the n-type heavily doped region.

According to one aspect of the present invention, the isolation region includes a vertical oxide layer and an insulation plug. The vertical oxide layer covers a sidewall of the trench and a horizontal oxide layer covering a bottom wall of the trench. The insulation plug is in the trench and on the horizontal oxide layer.

According to one aspect of the present invention, an edge of the vertical oxide layer is underneath the gate structure, and a distance between the edge of the vertical oxide layer and an edge of the gate structure is $\frac{1}{10}$~$\frac{1}{4}$ of a length of the gate structure.

According to one aspect of the present invention, the MOSFET structure further includes a shallow trench isolation region surrounding sidewalls of the first conductive region, and a bottom wall of the first conductive region is isolated from the semiconductor substrate by the isolation region.

Another embodiment of the present invention provides a MOSFET structure. The MOSFET structure includes a semiconductor substrate, a first trench, a second trench, a first isolation region, a second isolation region, a gate structure, a channel region, a drain region, and a source region. The semiconductor substrate has a semiconductor surface. The first trench and the second trench are formed below the semiconductor surface. The first isolation region is in the first trench and a second isolation region is in the second trench. The gate structure is above the semiconductor surface, the gate structure includes a gate isolation layer above the semiconductor surface, and a gate conductive layer is above the gate isolation layer. The channel region is under the gate structure. The drain region has a first doping type on the first isolation region. The source region has the first doping type on the second isolation region. A distance between an edge of the first isolation region and an edge of the second isolation region is smaller than a length of the gate structure.

According to one aspect of the present invention, the distance between the edge of the first isolation region and the edge of the second isolation region is $\frac{1}{2}$~$\frac{4}{5}$ of the length of the gate structure.

According to one aspect of the present invention, the MOSFET structure further includes a first vertical screening layer contacting with the drain region, wherein a doping type of the first vertical screening layer is different from the first doping type of the drain region.

According to one aspect of the present invention, a doping concentration of the first vertical screening layer is the same or substantially the same as that of the channel region.

According to one aspect of the present invention, a P-N junction is between the first vertical screening layer and the drain region, and the P-N junction extends upward from the first isolation region, and is aligned or substantially aligned with an edge of the gate structure.

According to one aspect of the present invention, the channel region, the first vertical screening layer and the drain region are independent from the semiconductor substrate.

According to one aspect of the present invention, the channel region, the first vertical screening layer and the drain region are selectively grown.

Another embodiment of the present invention provides a MOSFET structure surrounded by a shallow trench isolation region. The MOSFET structure includes a semiconductor substrate, a first trench, a second trench, a first isolation region, a second isolation region, a gate structure, a channel region, a drain region, a source region, and a first vertical screening layer. The semiconductor substrate has a semiconductor surface. The first trench and the second trench are formed below the semiconductor surface. The first isolation region is in the first trench and the second isolation region in the second trench. The gate structure is above the semiconductor surface. The channel region is under the gate structure. The drain region has a first doping type on the first isolation region. The source region has the first doping type on the second isolation region. The first vertical screening layer is between the drain region and the channel region, wherein a doping type of the first vertical screening layer is different from the first doping type of the drain region, and the first vertical screening layer and the drain region are independent from the semiconductor substrate.

According to one aspect of the present invention, a horizontal thickness of the first vertical screening layer is 2~5 nm.

According to one aspect of the present invention, the first vertical screening layer contacts the semiconductor substrate and the channel region through a first contacting area, and the first contacting area is defined by the first isolation region and the shallow trench isolation region.

According to one aspect of the present invention, three sidewalls of the drain region is isolated from the semiconductor substrate by the shallow trench isolation region, and a bottom wall of the first conductive region is isolated from the semiconductor substrate by the first isolation region.

According to one aspect of the present invention, the planar MOSFET structure is formed by a technology node $\lambda$, and a length of the gate structure is between 1.2$\lambda$~2.4$\lambda$ when $\lambda$ is between 12 nm~30 nm.

According to one aspect of the present invention, the drain region includes a light doped region and a heavily doped region, and an edge of the light doped region is aligned or substantially aligned with an edge of the gate structure.

According to one aspect of the present invention, the channel region, the first vertical screening layer and the drain region are independent from the semiconductor substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The patent or application file contains at least one drawing executed in color. Copies of this patent or patent application publication with color drawing (s) will be provided by the Office upon request and payment of the necessary fee.

FIG. 17 is a diagram illustrating the proposed planar NMOS transistor of the present invention with the p-type vertical screening layer.

DETAILED DESCRIPTION

Figure 1:
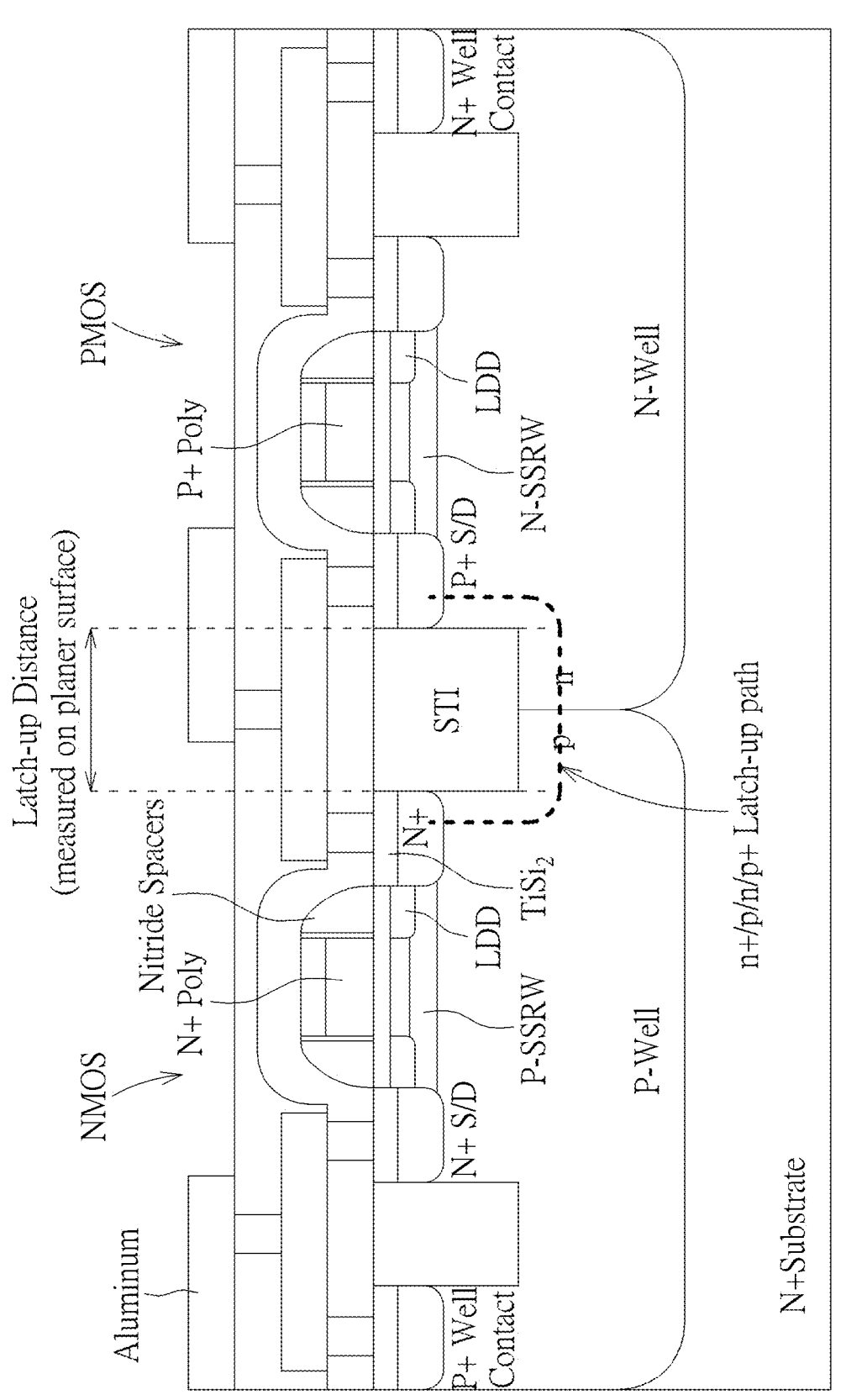
FIG. 1 shows a state-of-the-art CMOS which includes a p-type metal-oxide-semiconductor (PMOS) transistor and an n-type metal-oxide-semiconductor (NMOS) transistor.
Figure 2A:
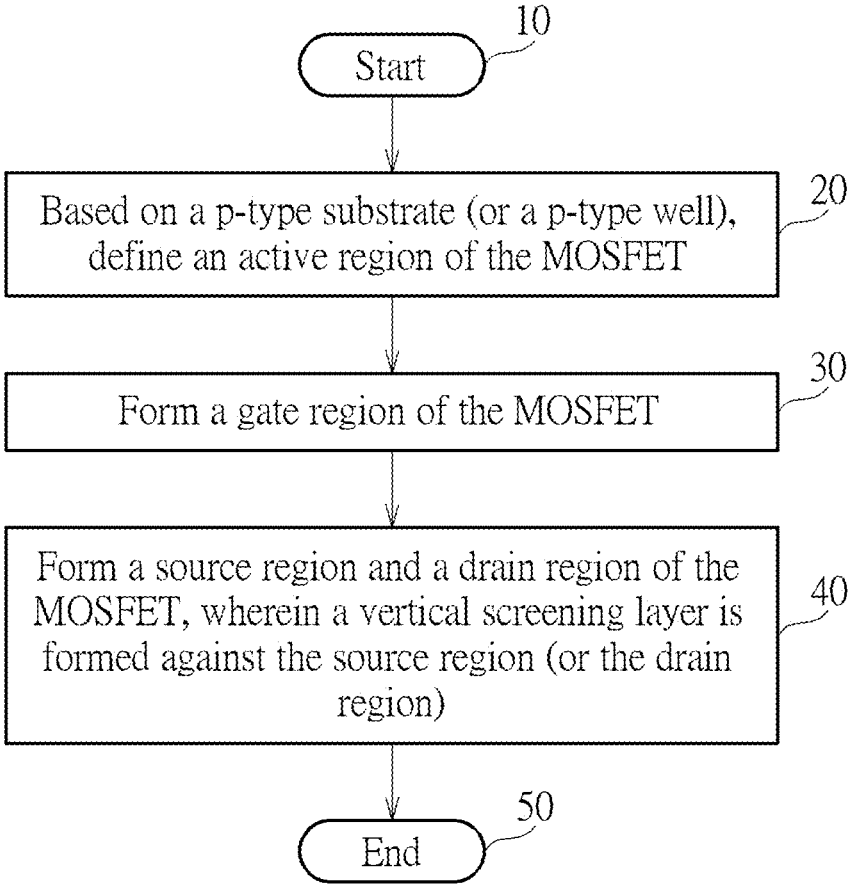
FIG. 2A is a flowchart illustrating a manufacturing method of a metal-oxide-semiconductor field-effect transistor (MOSFET) with lower leakage current and reserved gate length according to one embodiment of the present invention.

Please refer to FIGS. 2A, 2B, 2C, 2D, 3-16, wherein FIG. 2A is a flowchart illustrating a manufacturing method of a metal-oxide-semiconductor field-effect transistor (MOS-FET) with low leakage current and reserved gate length according to one embodiment of the present invention. Detailed steps are as follows:

Step 10: Start.

Step 20: Based on a p-type substrate (or a p-type well) 200, define an active region of the MOSFET.

Step 30: Form a gate region (or gate structure) of the MOSFET.

Step 40: Form a source region and a drain region of the MOSFET, wherein a vertical screening layer is formed against the source region (or the drain region).

Step 50: End.

Figure 2B:
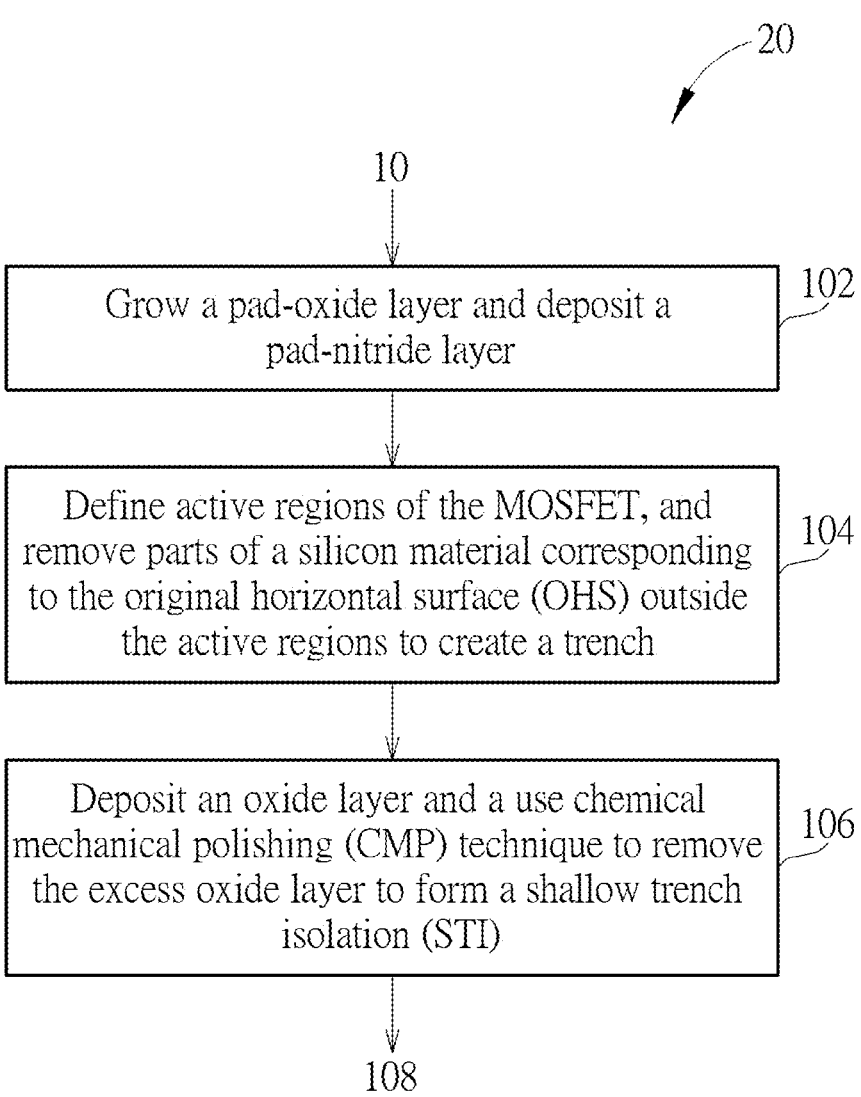
FIG. 2B, FIG. 2C, FIG. 2D are diagrams illustrating FIG. 2A.
Figure 2C:
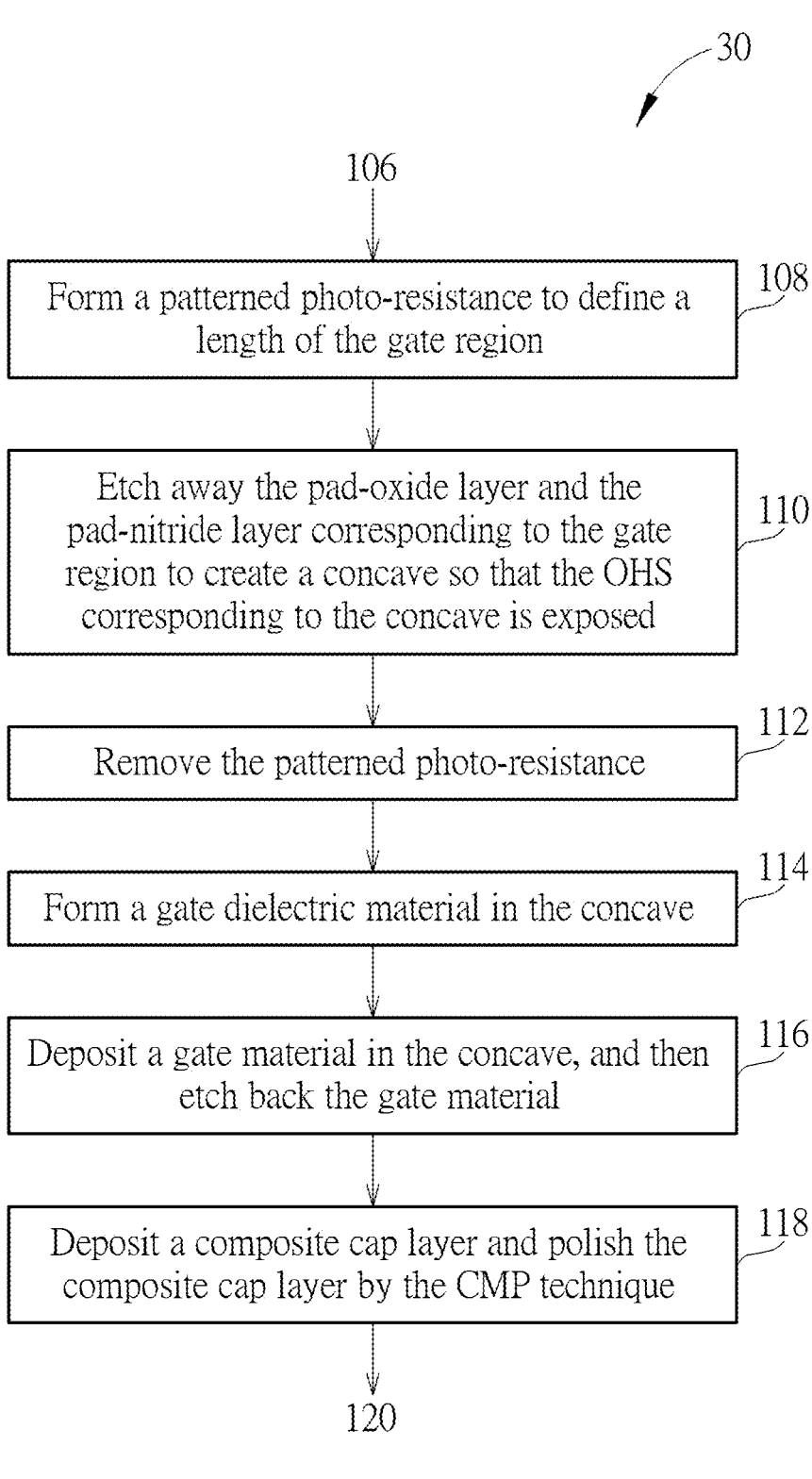
Figure 2D:
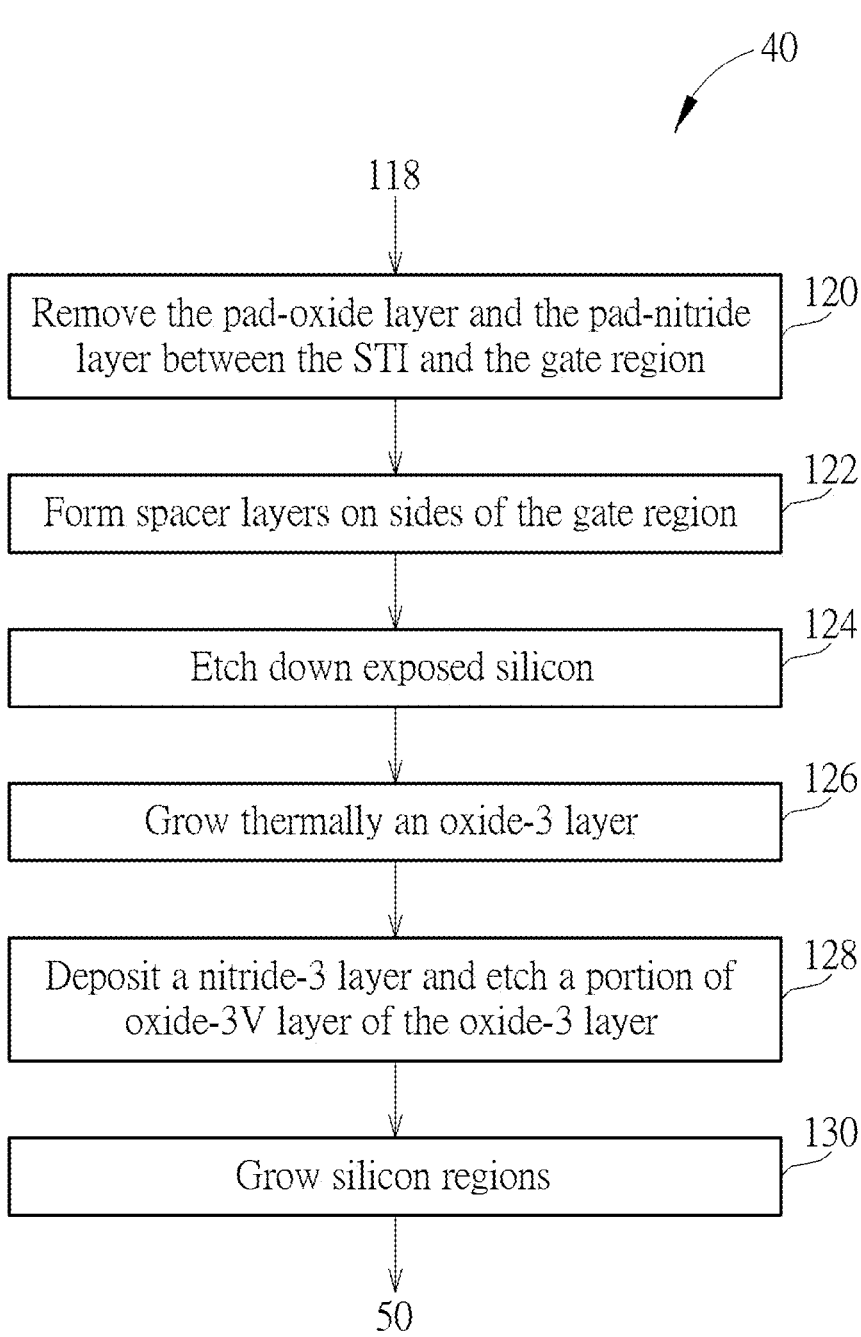
Figure 3:
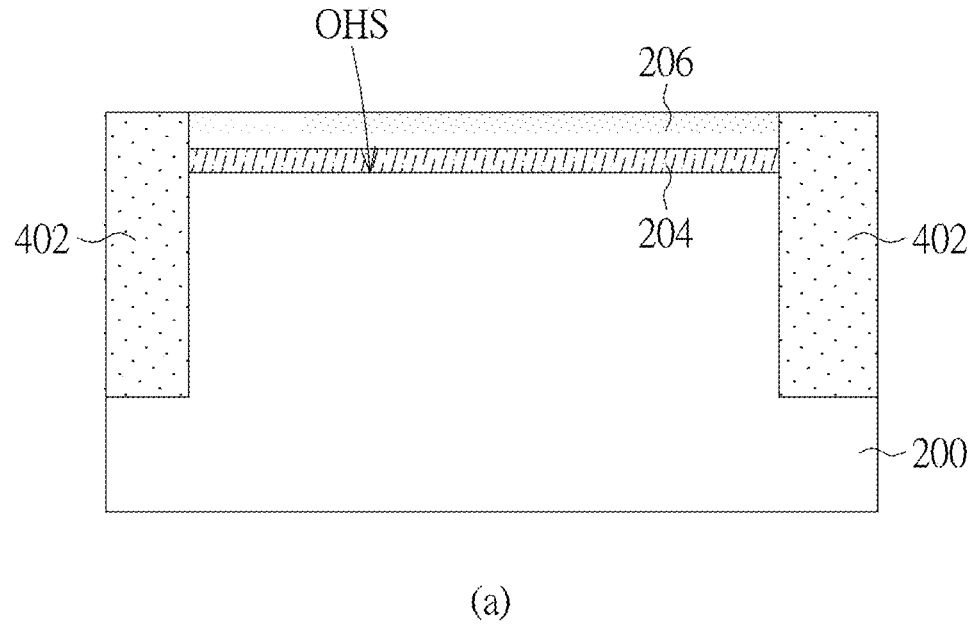
FIG. 3 is a diagram illustrating the pad-oxide layer being grown, the pad-nitride layer being deposited, and the shallow trench isolation (STI) being formed.
Figure 3:
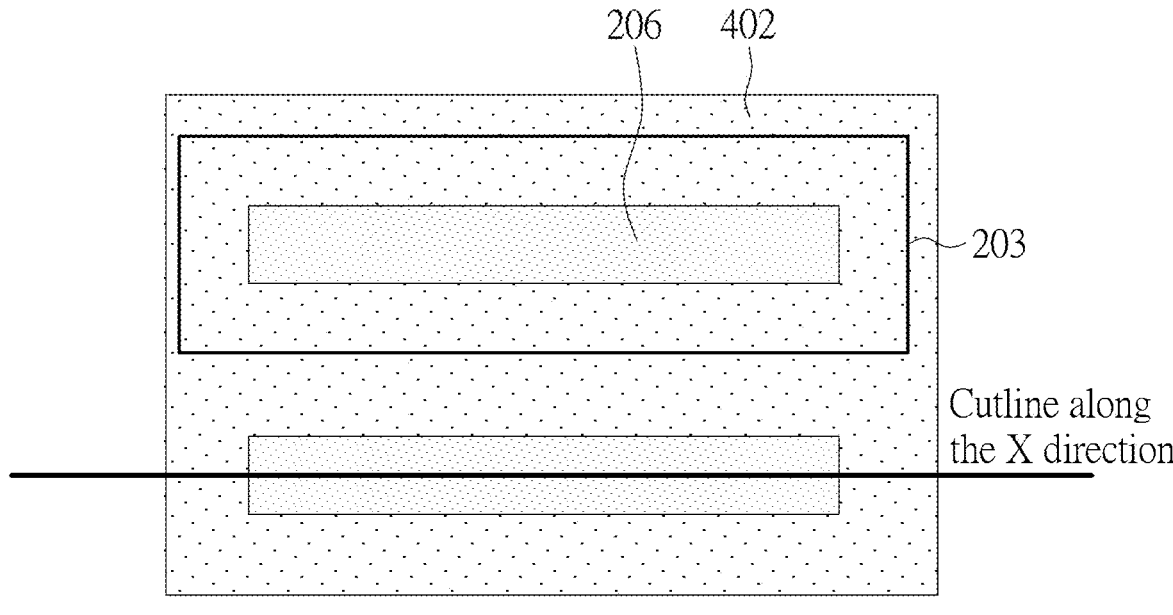

Please refer to FIG. 2B and FIG. 3. Step 20 could include:

Step 102: Grow a pad-oxide layer 204 and deposit a pad-nitride layer 206.

Step 104: Define active regions of the MOSFET, and remove parts of the substrate material (such as, silicon) corresponding to the original horizontal surface (OHS) outside the active regions to create a trench.

Step 106: Deposit an oxide layer and a use chemical mechanical polishing (CMP) technique to remove the excess oxide layer to form a shallow trench isolation (STI) 402.

Then, please refer to FIG. 2C and FIGS. 4, 5, 6. Step 30 could include:

Step 108: Form a patterned photo-resistance 403 to define a length Lgate of the gate region.

Step 110: Etch away the pad-oxide layer 204 and the pad-nitride layer 206 corresponding to the gate region to create a concave 404 so that the OHS corresponding to the concave 404 is exposed.

Step 112: Remove the patterned photo-resistance 403.

Step 114: Form a gate dielectric material 502 in the concave 404.

Step 116: Deposit a gate material 504 in the concave 404, and then etch back the gate material 504.

Step 118: Deposit a composite cap layer 506 and polish the composite cap layer 506 by the CMP technique.

Please refer to FIG. 2D, FIGS. 7, 8, 9, 10, 11. Step 40 could include:

Step 120: Remove the pad-oxide layer 204 and the pad-nitride layer 206 between the STI 402 and the gate region.

Step 122: Form spacer layers on sides of the gate region.

Step 124: Etch down exposed silicon.

Step 126: Grow thermally an oxide-3 layer 1002.

Step 128: Deposit a nitride-3 layer 1006 and etch a portion of oxide-3V layer 10022 of the oxide-3 layer 1002.

Step 130: Grow silicon regions.

Detailed description of the aforesaid manufacturing method is as follows. Start with the well-designed p-type substrate 200. A simple planar n-type metal-oxide-semiconductor (NMOS) transistor is used as an example to illustrate the key features of the present invention, while similar processes and structure can also be applied to a planar p-type metal-oxide-semiconductor (PMOS) transistor, which is made in an n-well 203 (shown in FIG. 3(*b*)) of the p-type substrate 200.

In Step 102, as shown in FIG. 3(*a*), grow the pad-oxide layer 204 with well-designed thickness over the OHS and deposit the pad-nitride layer 206 with well-designed thickness on a top surface of the pad-oxide layer 204.

In Step 104, as shown in FIG. 3(*a*), use a photolithographic masking technique to define the active regions of the NMOS transistor by an anisotropic etching technique, wherein the anisotropic etching technique removes parts of the silicon material corresponding to the OHS outside the active regions to create the trench for future STI (shallow trench isolation) needs.

In Step 106, as shown in FIG. 3(*a*), deposit the thick oxide layer to fully fill the trench and use the CMP technique to remove the excess oxide layer to form the STI 402, wherein a top surface of the STI 402 is in level up to a top surface of the pad-nitride layer 206, and the STI 402 surrounds the active region to prevent from collapsing during the forming the source/the drain or the gate of the NMOS transistor when the transistor is a fin structured transistor. It is noticed that the top surface of the STI 402 is higher than the OHS. In addition, FIG. 3(*b*) is a top view corresponding to FIG. 3(*a*), wherein FIG. 3(*a*) is a cross-section view along a cutline of an X direction shown in FIG. 3(*b*).

Figure 4:
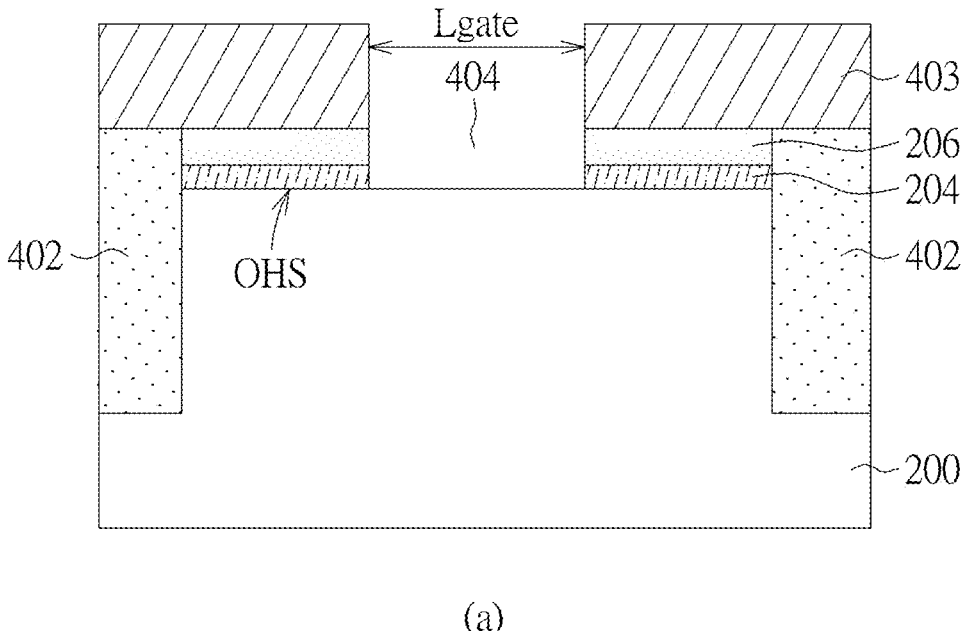
FIG. 4 is a diagram illustrating the patterned photo-resistance being formed, and the pad-oxide layer and the pad-nitride layer being etched away to create the concave.
Figure 4:
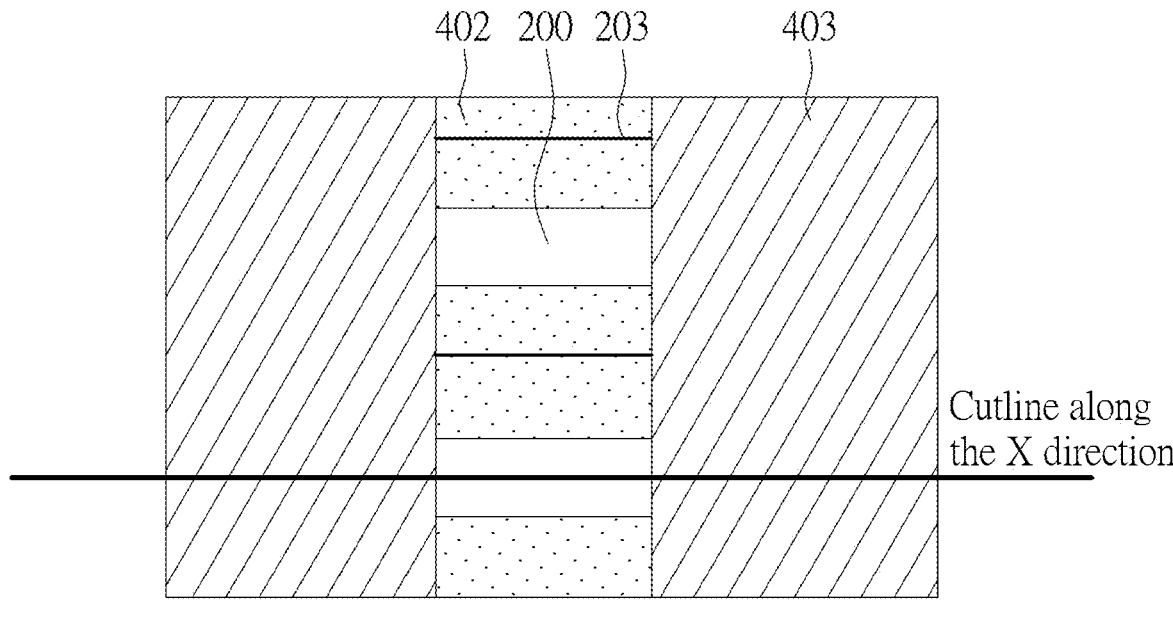

In Step 108, as shown in FIG. 4(*a*), then use the photolithographic masking technique (e.g. forming the patterned photo-resistance 403) to define the length Lgate of the gate region.

In Step 110, as shown in FIG. 4(*a*), the pad-oxide layer 204 and the pad-nitride layer 206 corresponding to the gate region are removed (i.e. the pad-oxide layer 204 and the pad-nitride layer 206 not covered by the patterned photo-resistance 403 are removed) to create the concave 404. In addition, FIG. 4(*b*) is a top view corresponding to FIG. 4(*a*), wherein FIG. 4(*a*) is a cross-section view along a cutline of an X direction shown in FIG. 4(*b*).

Figure 5:
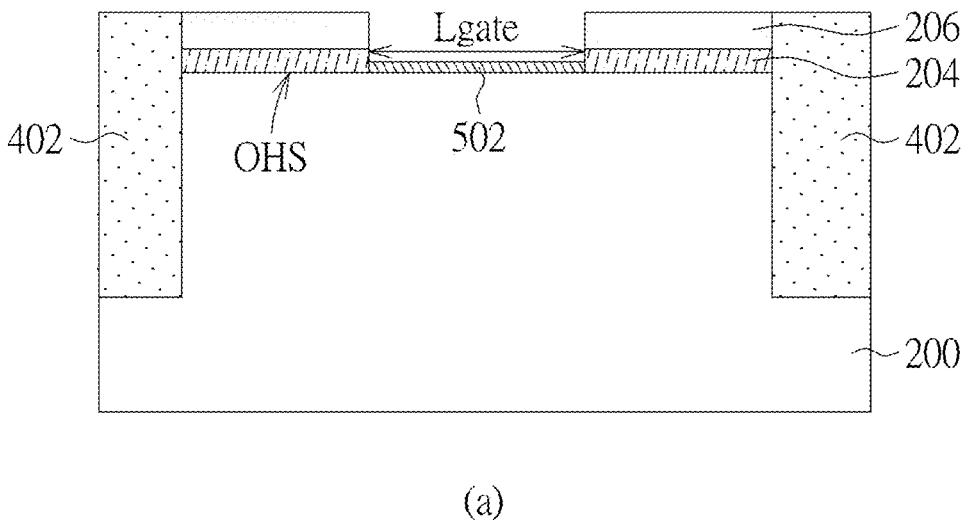
FIG. 5 is a diagram illustrating the patterned photo-resistance being removed and the gate dielectric material being formed in the concave.
Figure 5:
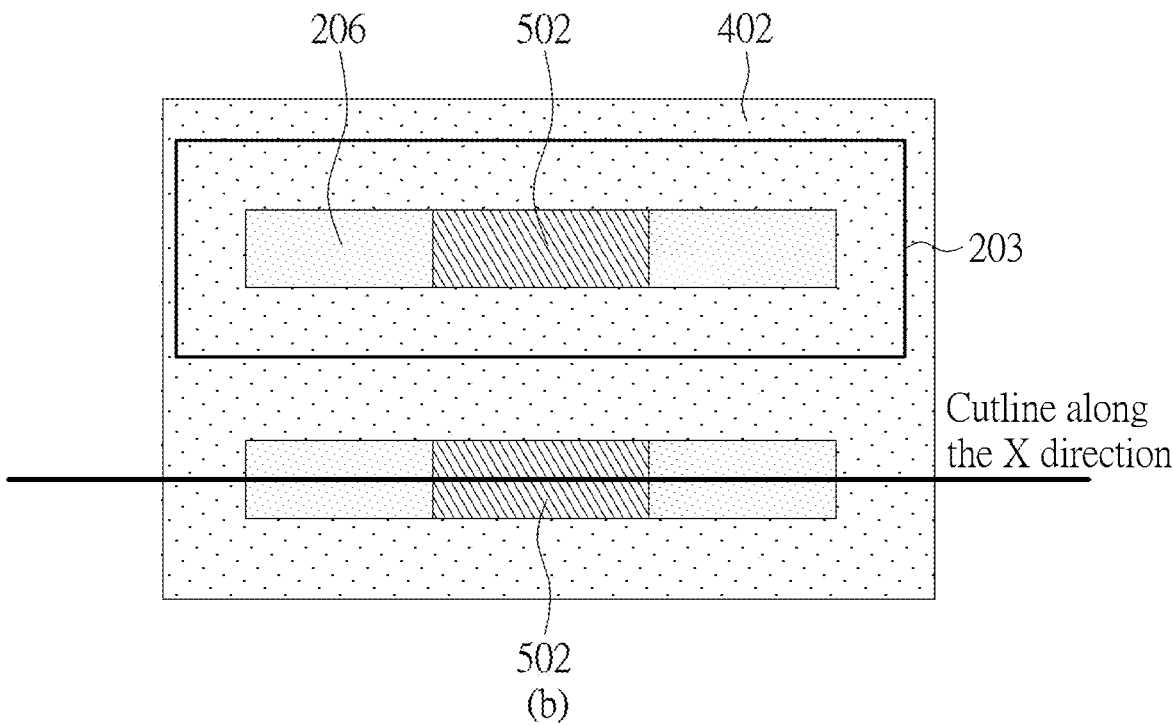

In Step 114, as shown in FIG. 5(*a*), after the patterned photo-resistance 403 is removed, the gate dielectric material 502 (e.g. a thermal oxide layer or a High-K dielectric layer (e.g. HfO₂)) is formed in the concave 404 as a gate insulator over the OHS. In addition, FIG. 5(*b*) is a top view corresponding to FIG. 5(*a*), wherein FIG. 5(*a*) is a cross-section view along a cutline of an X direction shown in FIG. 5(*b*).

Figure 6:
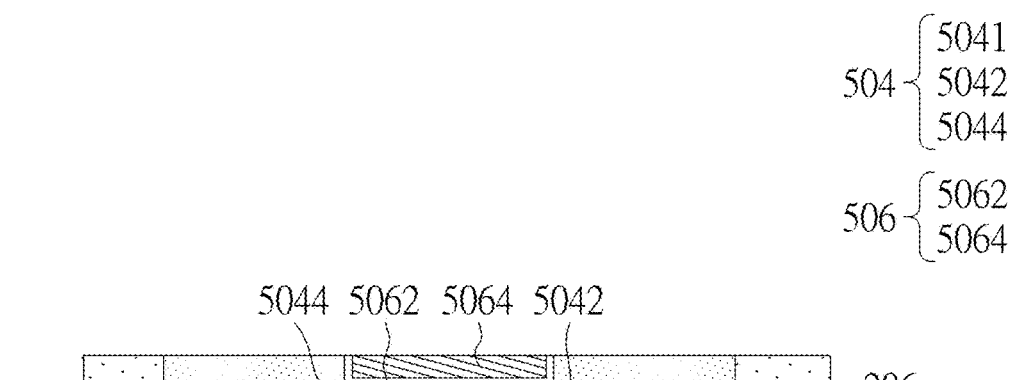
FIG. 6 is a diagram illustrating the gate material being formed and the composite cap layer being deposited.
Figure 6:
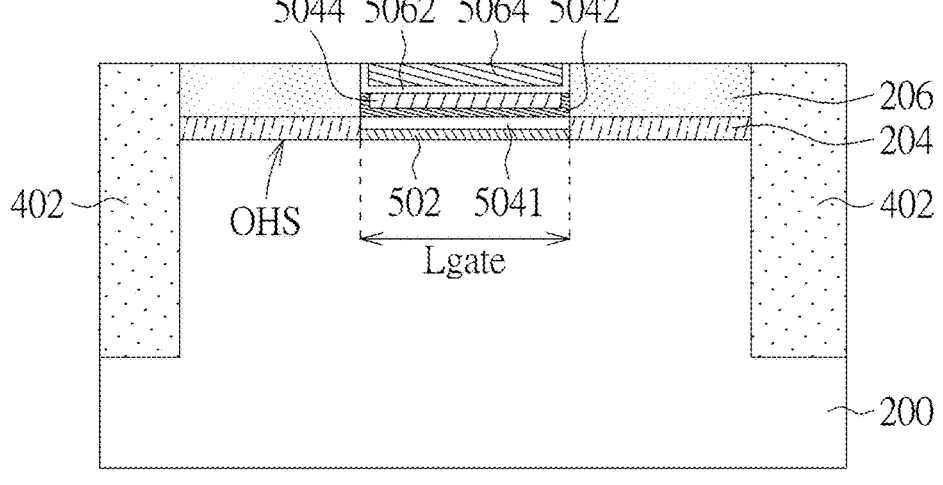
Figure 6:
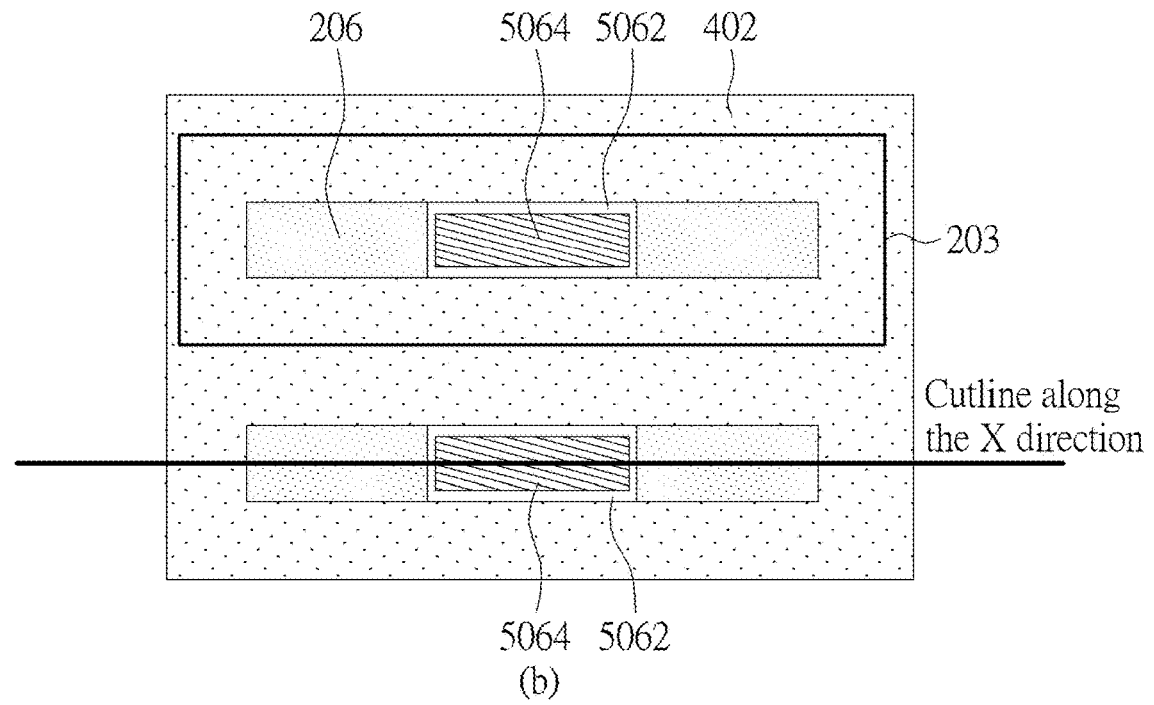

In Step 116, as shown in FIG. 6(*a*), the gate material 504 (e.g. including n+ polysilicon 5041, Ti/TiN 5042 over n+ polysilicon 5041, and Tungsten 5044 over Ti/TiN 5042) is deposited above the gate dielectric material 502. Then the gate material 504 is polished by the CMP technique to make a top surface of the gate material 504 in level up to the top surface of the pad-nitride layer 206, and etch back the gate material 504 to make the top surface of the gate material 504 lower than the top surface of the pad-nitride layer 206.

In Step 118, as shown in FIG. 6(*a*), then deposit the composite cap layer 506 composed of a nitride layer 5062 and an oxide layer 5064 into the concave 404 on the top surface of the gate material 504, wherein the composite cap layer 506 is used for protecting the gate material 504. Then, the composite cap layer 506 is polished by the CMP technique to make a top surface of the composite cap layer 506 in level up to the top surface of the pad-nitride 206. Thus, the gate region of the NMOS transistor is completed. In addition, FIG. 6(*b*) is a top view corresponding to FIG. 6(*a*), wherein FIG. 6(*a*) is a cross-section view along a cutline of an X direction shown in FIG. 6(*b*).

Figure 7:
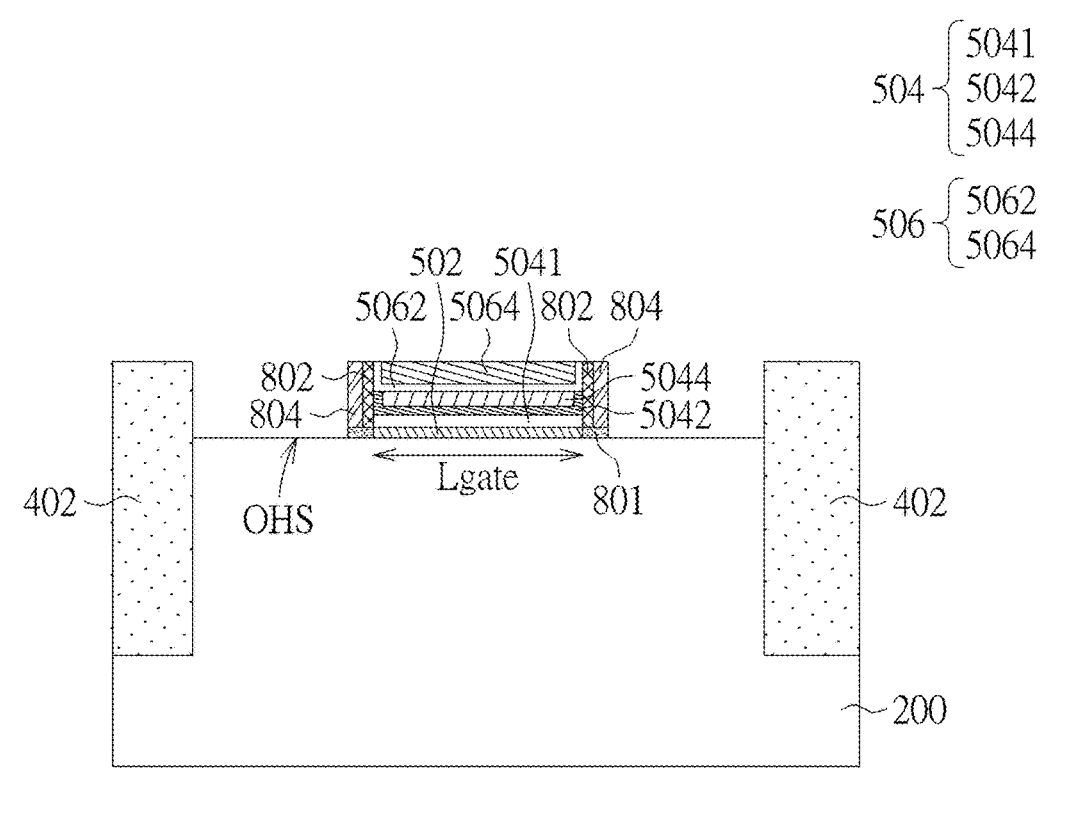
FIG. 7 is a diagram illustrating the pad-oxide layer and the pad-nitride layer being removed and the spacer layers on sides of the gate region being formed.
Figure 7:
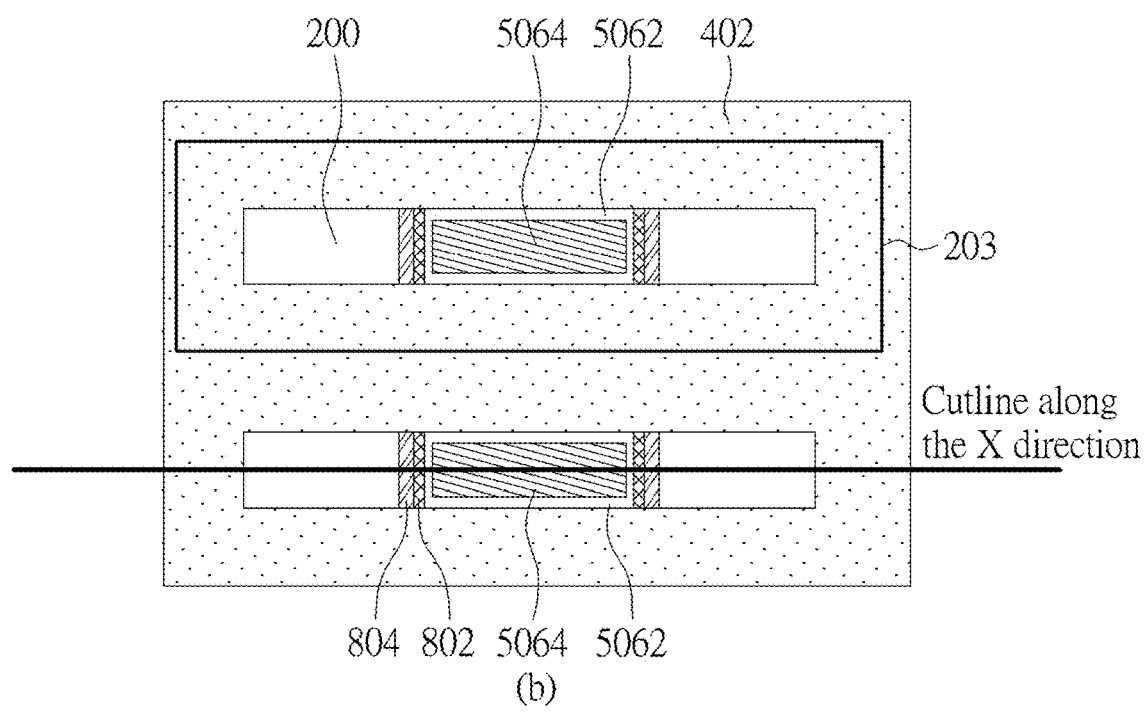

In Step 120, as shown in FIG. 7(*a*), etch away the pad-oxide layer 204 and the pad-nitride layer 206 between the STI 402 and the gate region (including the gate material 504 and the composite cap layer 506) to expose the OHS of the p-type substrate 200.

In Step 122, as shown in FIG. 7(*a*), the spacer layers on sides of the gate region may include a thin-oxide-1 layer 801, a thin-nitride-1 layer 802, and a thin-oxide-2 layer 804, wherein the thin-oxide-1 layer 801 is thermally grown on the OHS, the thin-nitride-1 layer 802 is deposited on the sides of the gate region, the thin-oxide-2 layer 804 is deposited on the thin-nitride-1 layer 802, and the thin-nitride-1 layer 802 and the thin-oxide-2 layer 804 are over the thin-oxide-1 layer 801. Thus, the source region and the drain region of the NMOS transistor between the spacer layers and the STI 402 are well defined. In addition, FIG. 7(*b*) is a top view corresponding to FIG. 7(*a*), wherein FIG. 7(*a*) is a cross-section view along a cutline of an X direction shown in FIG. 7(*b*).

Figure 8:
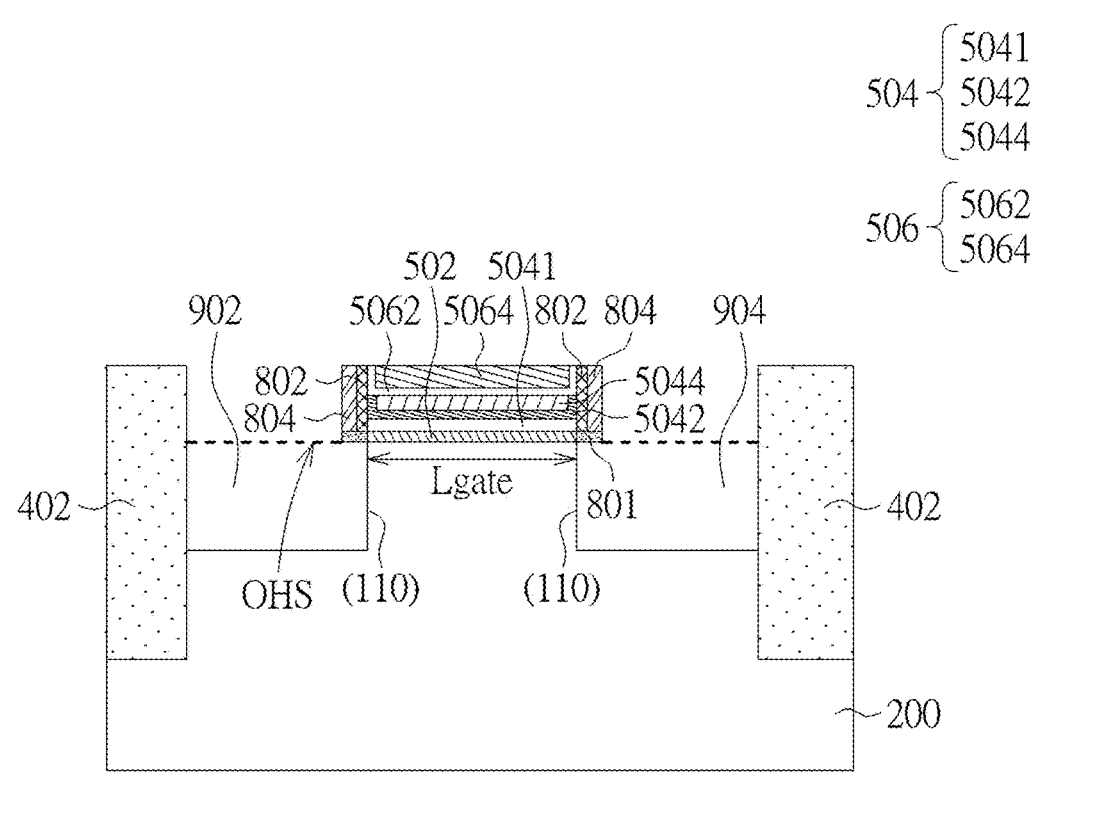
FIG. 8 is a diagram illustrating some exposed silicon areas being etched away to create shallow trenches for the source region and the drain region.
Figure 8:
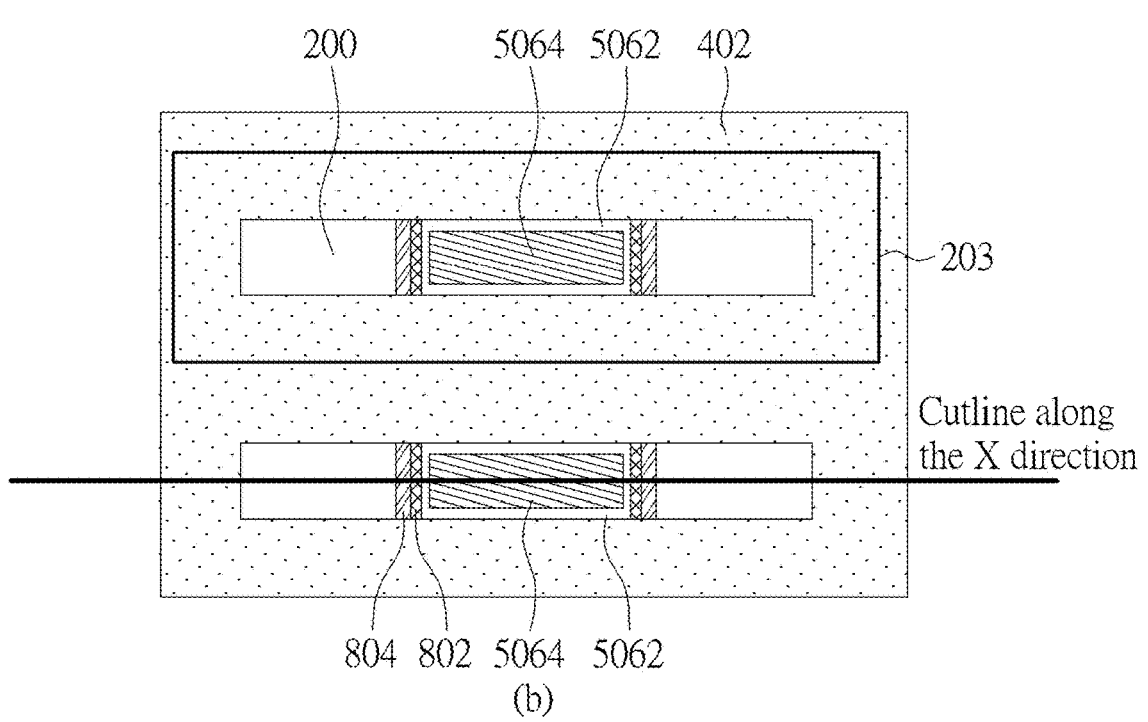

In Step 124, as shown in FIG. 8(*a*), then utilize the anisotropic etching technique to etch down exposed silicon areas of the p-type substrate 200 to create shallow source trench 902 and drain trench 904 for the source region and the drain region of the NMOS transistor, respectively. In addition, as shown in FIG. 8(*a*), each trench of the source trench 902 and the drain trench 904 includes an exposed vertical sidewall of the p-type substrate 200 with assuming a sharp crystalline orientation (110) right under the spacer layers. In this embodiment, the crystalline orientation (110) edge of the trench 902 or 904 could be aligned with the edge of the gate structure, as shown in FIG. 8(*a*). In another embodiment, the crystalline orientation (110) edge of the trench 902 or 904 could be aligned with the edge of the thin-nitride-1 layer 802 or the thin-oxide-2 layer 804. In addition, FIG. 8(*b*) is a top view corresponding to FIG. 8(*a*), wherein FIG. 8(*a*) is a cross-section view along a cutline of an X direction shown in FIG. 8(*b*).

Figure 9:
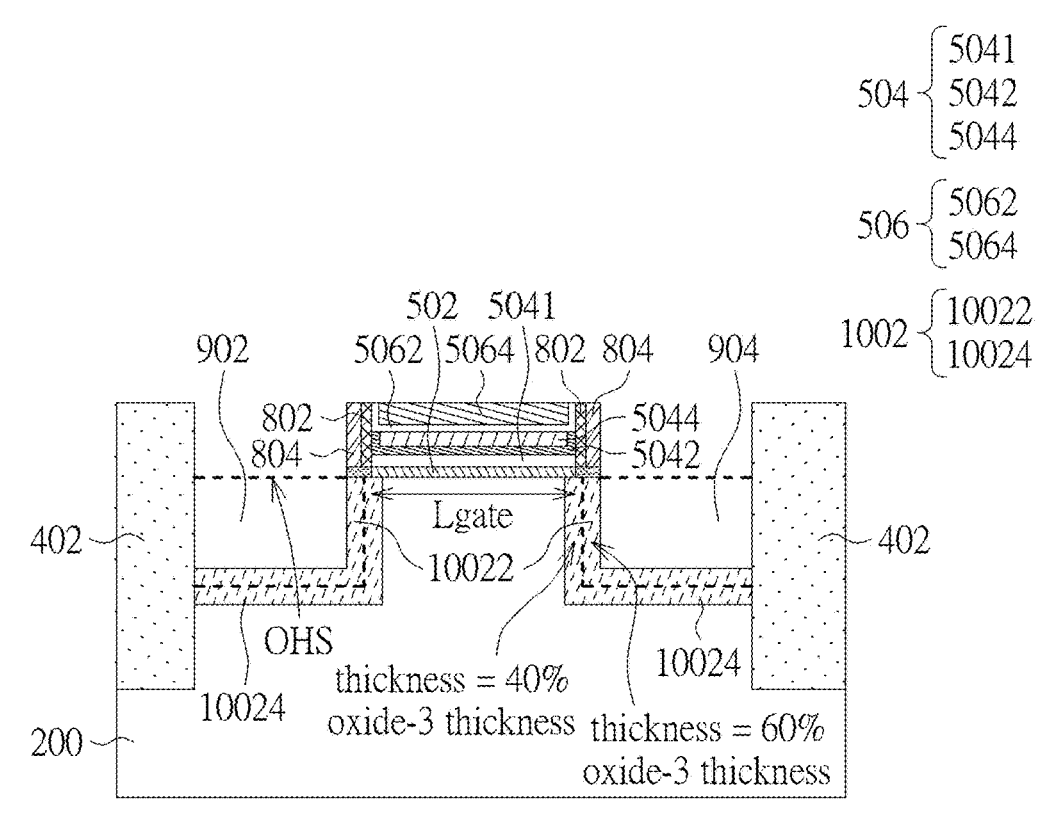
FIG. 9 is a diagram illustrating the oxide-3 layer being thermally grown.
Figure 9:
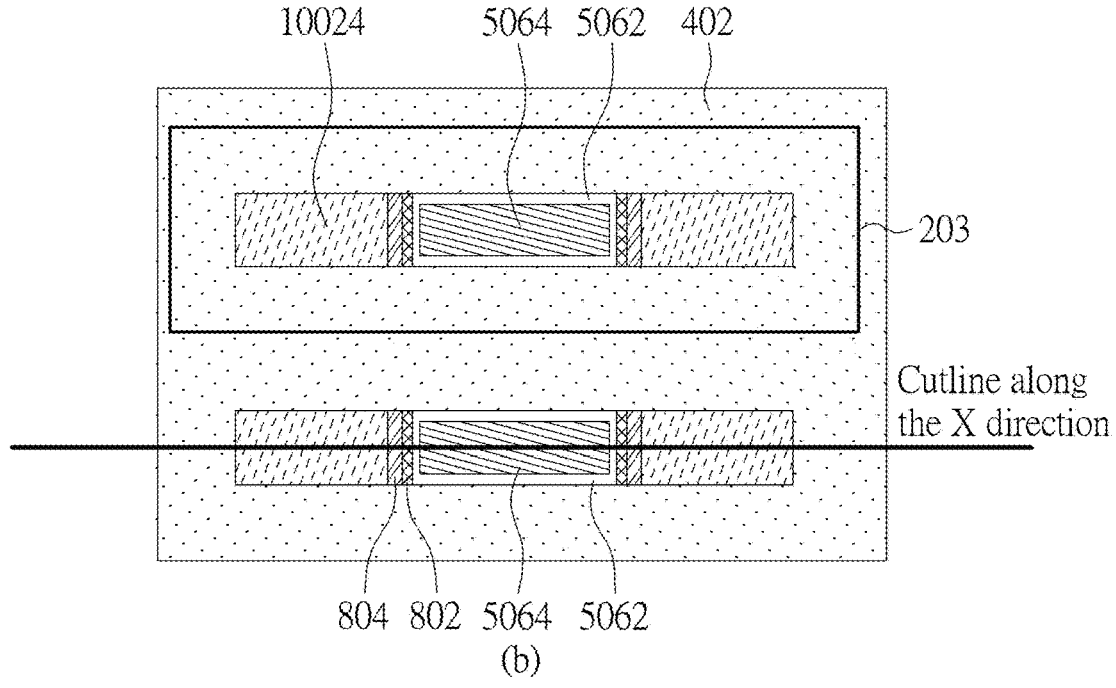

In Step 126, as shown in FIG. 9(*a*), in the source trench 902 and the drain trench 904, use a thermal oxidation process, called as an oxidation-3 process, to grow the oxide-3 layer 1002 (including both the oxide-3V layers 10022 penetrating the exposed vertical sidewalls (with the sharp crystalline orientation (110)) of the p-type substrate 200 and oxide-3B layers 10024 on the top surfaces of the bottoms of the source trench 902 and the drain trench 904). Since most sidewalls of the source trench 902 and the drain trench 904 are against the STI 402, the oxidation-3 process should grow little oxide on the two sidewalls (with the sharp crystalline orientation (110)) of the source trench 902 and the drain trench 904, such that the width of the source region/drain region of the NMOS transistor is not really affected by such thermal oxidation process.

In addition, the thickness of the oxide-3V layer 10022 and the oxide-3B layer 10024 drawn in FIG. 9 and following figures are only shown for illustration purpose, and its geometry is not proportional to the dimension of the STI 402 shown in those figures. For example, in one embodiment of the present invention, the thickness of the oxide-3V layer 10022 and the oxide-3B layer 10024 could be around 2~5 nm, but the vertical height of the STI 402 could be around 200~400 nm. But it is very important to design the oxidation-3 process such that the thickness of oxide-3V layer 10022 can be very accurately controlled under both precisely controlled thermal oxidation temperature, timing and growth rate. Since the thermal oxidation over a well-defined silicon surface should result in that 40% of the thickness of the oxide-3V layer 10022 takes away the thickness of the exposed (110) silicon surface in the vertical wall of the p-type substrate 200 and the remaining 60% of the thickness of the oxide-3V layer 10022 is counted as an addition outside the vertical wall of the p-type substrate 200 (such a distribution of 40% and 600 on the oxide-3V layer 10022 is particularly drawn clearly by dash-lines in FIG. 9 since its importance will be further articulated in the following text). In addition, FIG. 9(*b*) is a top view corresponding to FIG. 9(*a*), wherein FIG. 9(*a*) is a cross-section view along a cutline of an X direction shown in FIG. 9(*b*).

Figure 10:
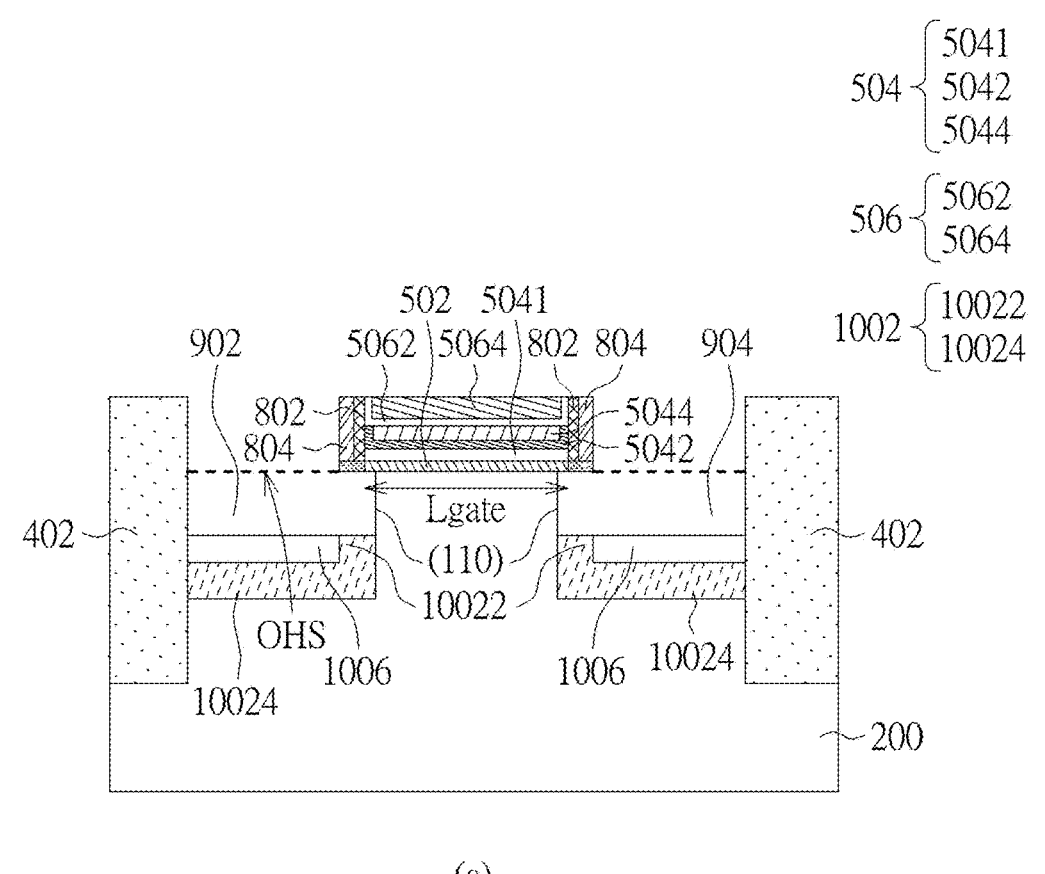
FIG. 10 is a diagram illustrating the nitride-3 layer being deposited and the portion of oxide-3V layer of the oxide-3 layer being etched away.
Figure 10:
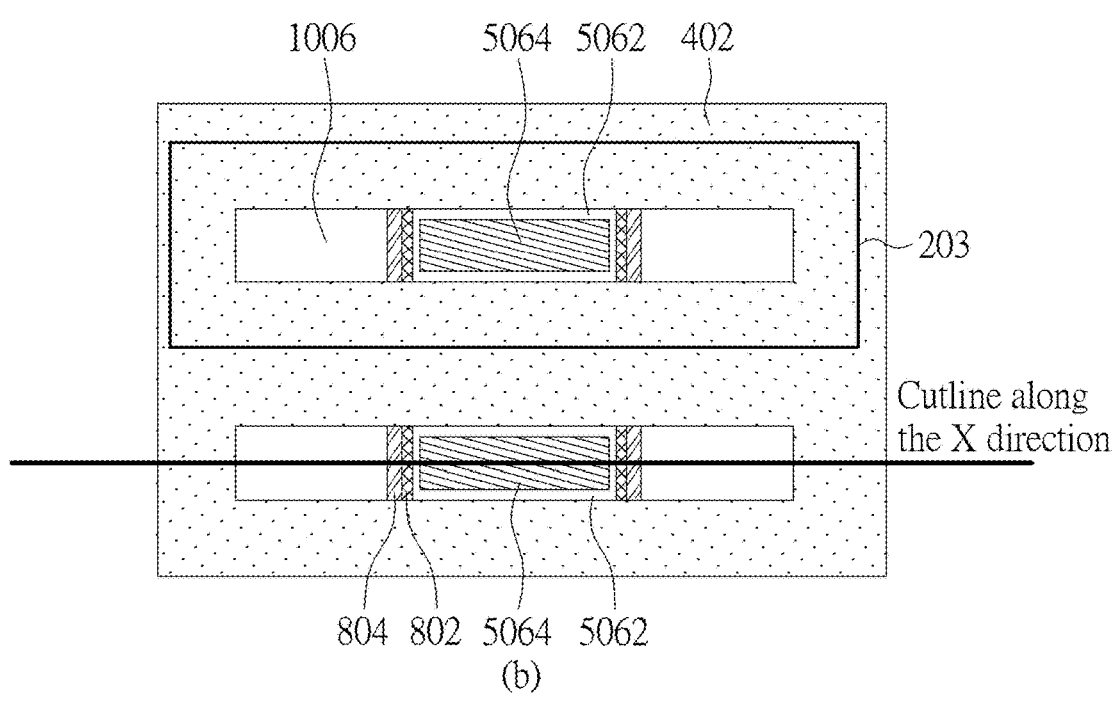

In Step 128, as shown in FIG. 10(*a*), deposit the nitride-3 layer 1006 (e.g. an insulation layer) over the wafer surface with sufficient thickness to fully fill up the source trench 902 and the drain trench 904 and then etch back to remove the unnecessary portion of the nitride-3 layer 1006 to leave only a suitable thickness of the nitride-3 layer 1006 inside the source trench 902 and the drain trench 904. As shown in FIG. 10(*a*), a combination of the oxide-3V layer 10022, the oxide-3B layer 10024, and the nitride-3 layer 1006 could be named as localized isolation into silicon substrate (LISS). It is mentioned that the nitride-3 layer 1006 could be replaced by any suitable insulation materials (such as oxide layer) as long as the oxide-3 layer 1002 remains most as well as being designed. Then, utilize a well-designed isotropic etching technique to remove the portion of the oxide-3V layer 10022 which stands above the height of the nitride-3 layer 1006 so as to expose the body of the p-type substrate 200, wherein the body has exposed silicon surface with the sharp crystalline orientation (110). It is noticed that the exposed body has a vertical boundary with a suitable recessed thickness in contrast to the edge of the gate region. In addition, FIG. 10(*b*) is a top view corresponding to FIG. 10(*a*), wherein FIG. 10(*a*) is a cross-section view along a cutline of an X direction shown in FIG. 10(*b*).

Figure 11:
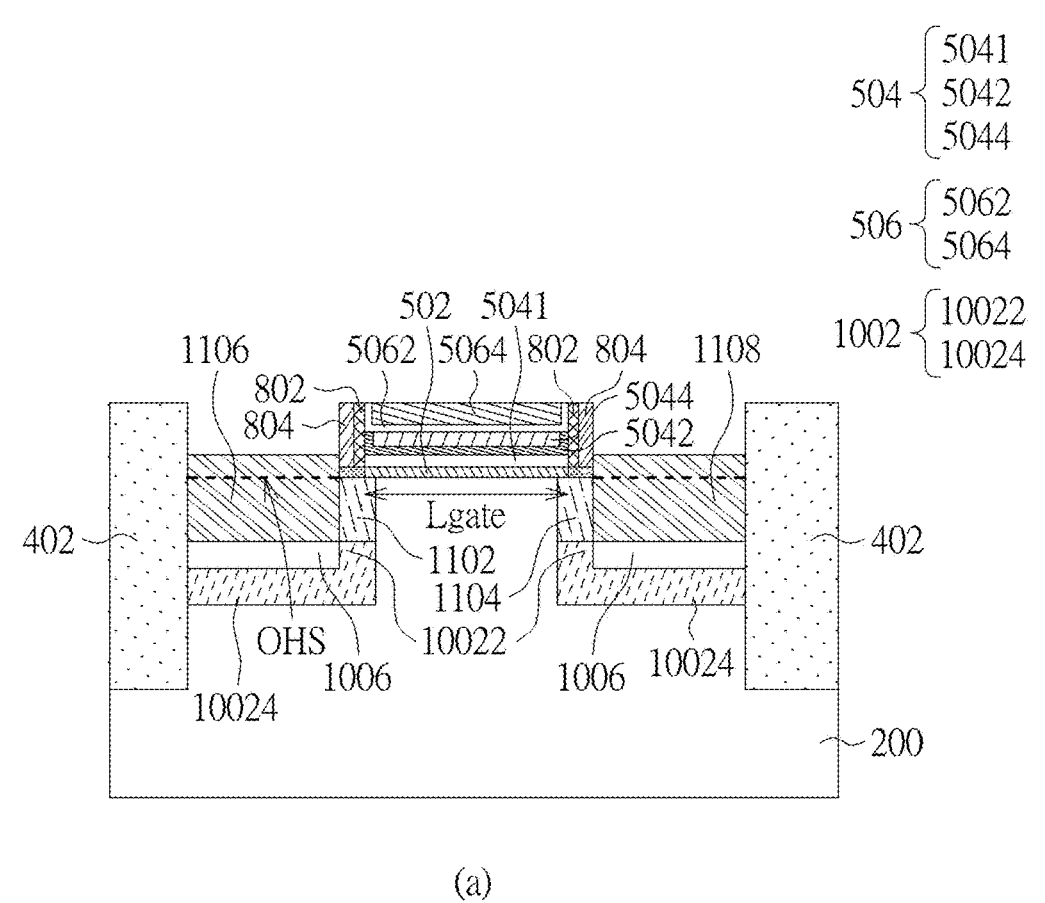
FIG. 11 is a diagram illustrating the silicon regions being grown.
Figure 11:
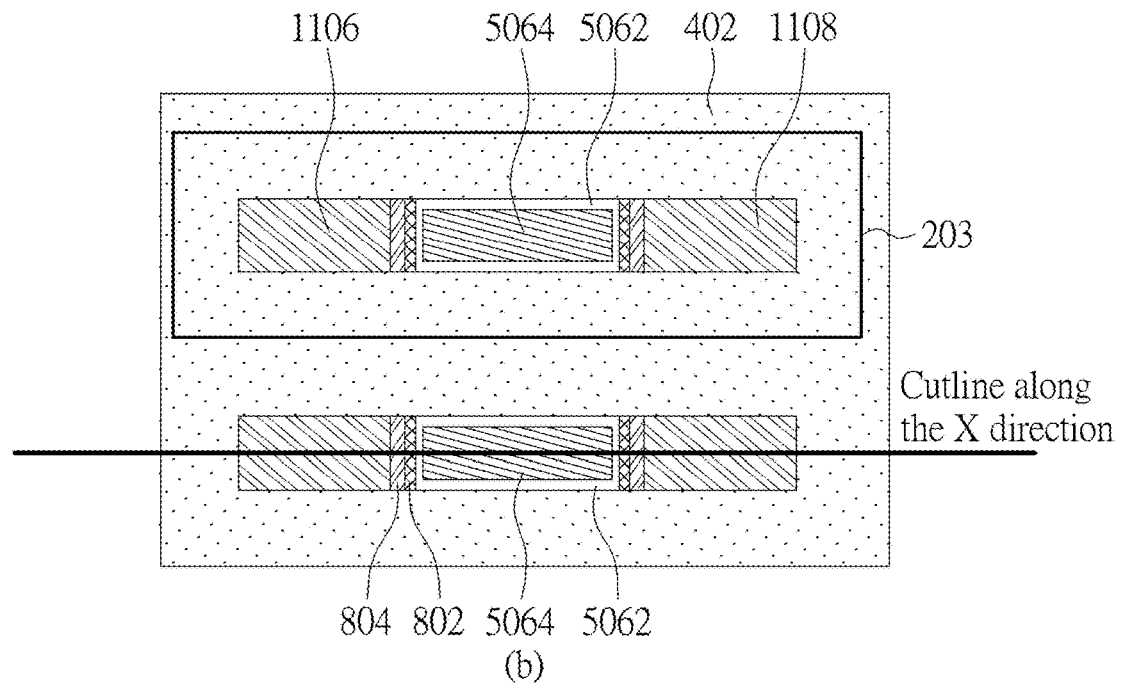

In Step 130, as shown in FIG. 11(*a*), then use a selective growth technique (or other suitable technology which may be Atomic Layer Deposition (ALD) or selective growth ALD (SALD)) to grow the silicon regions (i.e. the source/ drain regions) across the LISS from the exposed semiconductor body which is used as crystalline seed, wherein the silicon regions are well-organized (110) lattice silicon regions, the LISS has no seeding effect on changing (110) crystalline structures of the silicon regions. As shown in FIG. 11(*a*), in one embodiment of the present invention, the silicon regions include n-lightly doped drains (NLDDs) 1102, 1104, n+ doped source region 1106, and n+ doped drain region 1108 of the NMOS transistor. Similarly, when the NMOS transistor is the p-type metal-oxide-semiconductor (PMOS) transistor, the silicon regions could include p– LDDs and p+ doped source/drain regions. In addition, in another embodiment of the present invention, the silicon regions could include undoped regions, n– LDDs, and n+ doped source/drain regions. Thus, the source region and the drain region of the NMOS transistor are completed. In addition, FIG. 11(*b*) is a top view corresponding to FIG. 11(*a*), wherein FIG. 11(*a*) is a cross-section view along a cutline of an X direction shown in FIG. 11(*b*).

Figure 12:
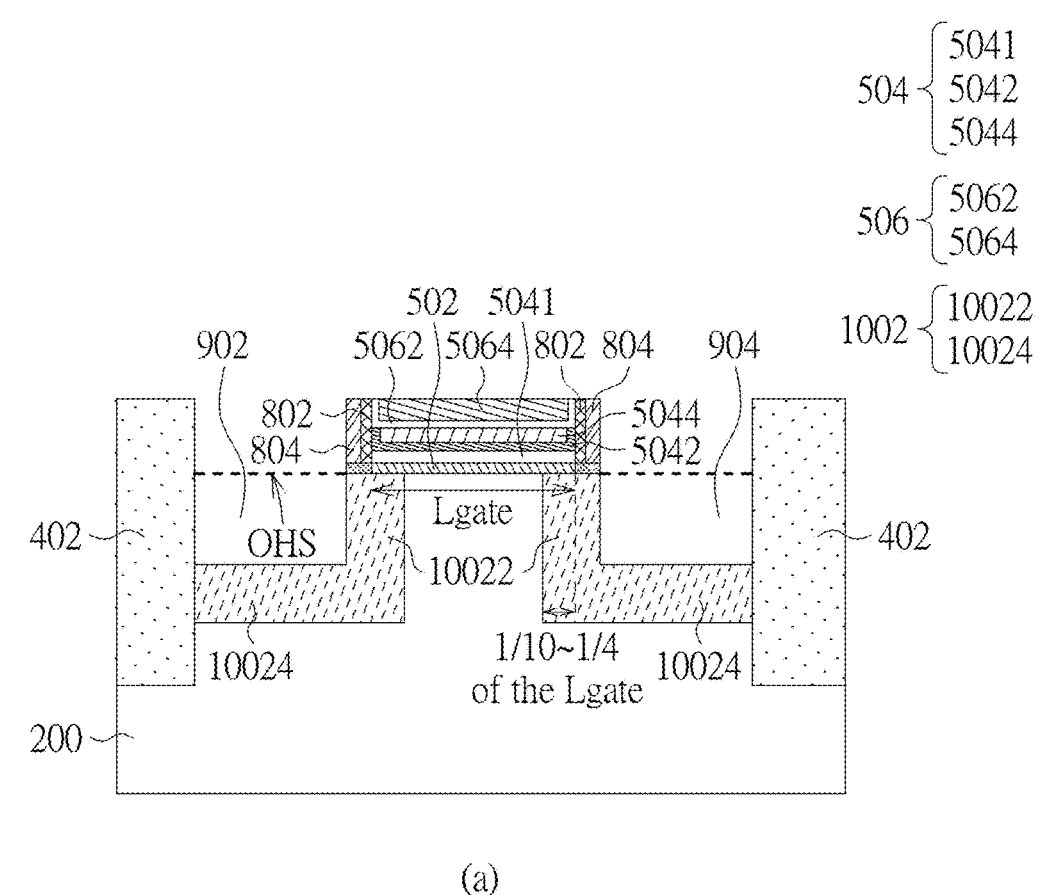
FIG. 12 is a diagram illustrating the thickness of the oxide-3 layer thermally grown being increased.
Figure 12:
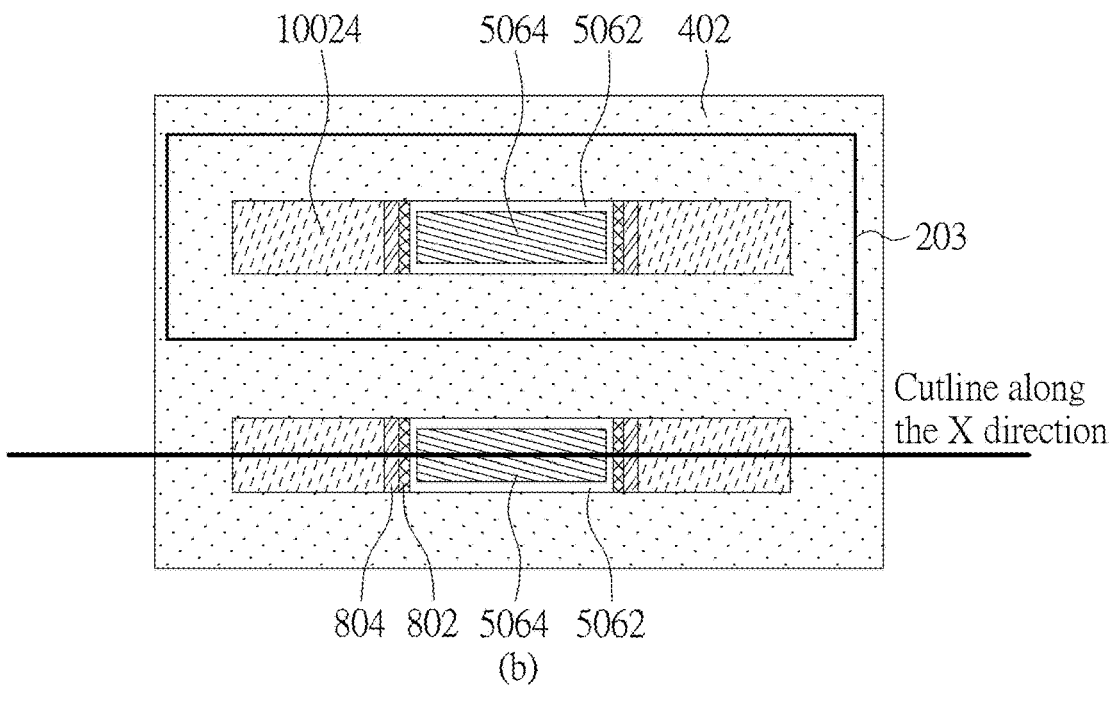

In addition, as shown in FIG. 12(*a*), in another embodiment of the present invention, the thickness of the oxide-3V layers 10022 and oxide-3B layers 10024 could be increased, such that the oxide-3V layers 10022 is underneath the gate region, rather than being aligned or substantially aligned with the edge of the gate region. As shown in FIG. 12(*a*), a distance between the edge of the oxide-3V layers 10022 and the edge of the gate region could be ⅒~¼ of the length Lgate of the gate region. The larger the distance between the edge of the oxide-3V layers 10022 and the edge of the gate region, the closer to the Silicon On Insulator (SOI) structure. Thus, considering both the oxide-3V layers 10022 in the source trench 902 and the drain trench 904, the distance between the edge of one oxide-3V layer 10022 and the edge of the other oxide-3V layer 10022 could be ½~⅘ of the length Lgate of the gate region. In addition, FIG. 12(*b*) is a top view corresponding to FIG. 12(*a*), wherein FIG. 12(*a*) is a cross-section view along a cutline of an X direction shown in FIG. 12(*b*).

Figure 13:
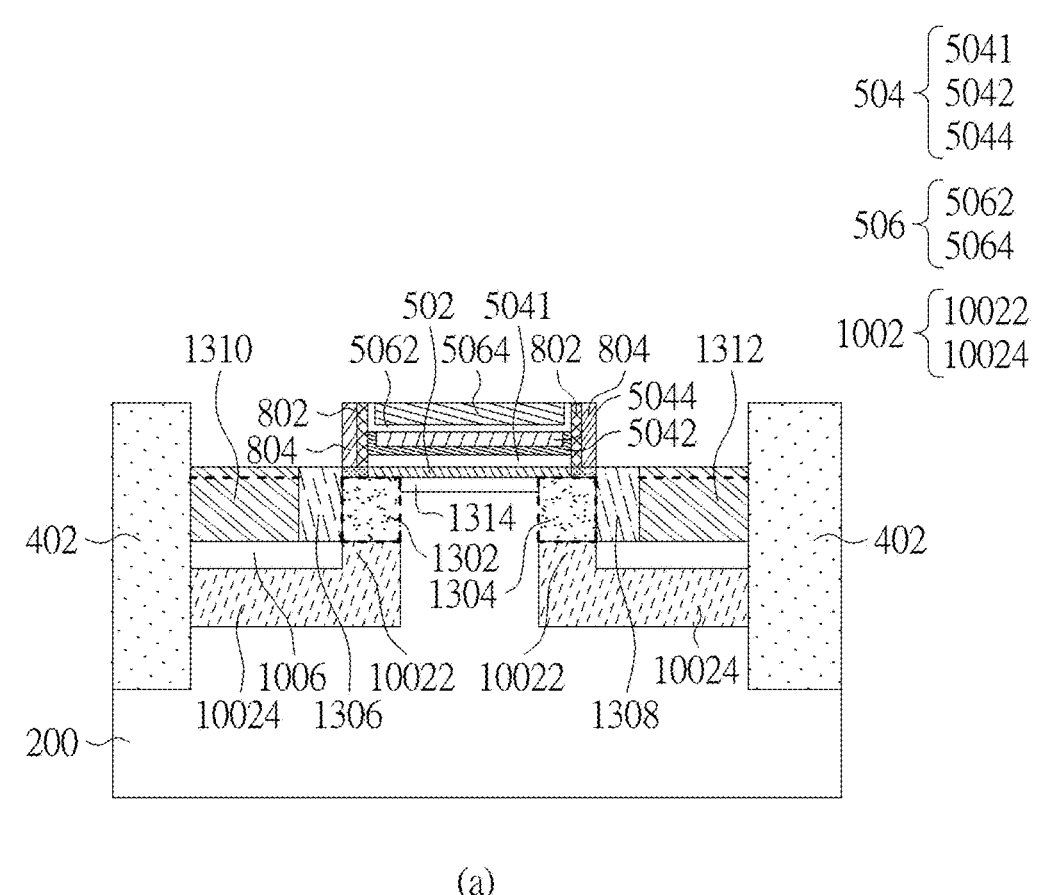
FIG. 13 is a diagram illustrating the p-type vertical screening layer being formed before the n-type lightly doped drain (LDD) region is formed.
Figure 13:
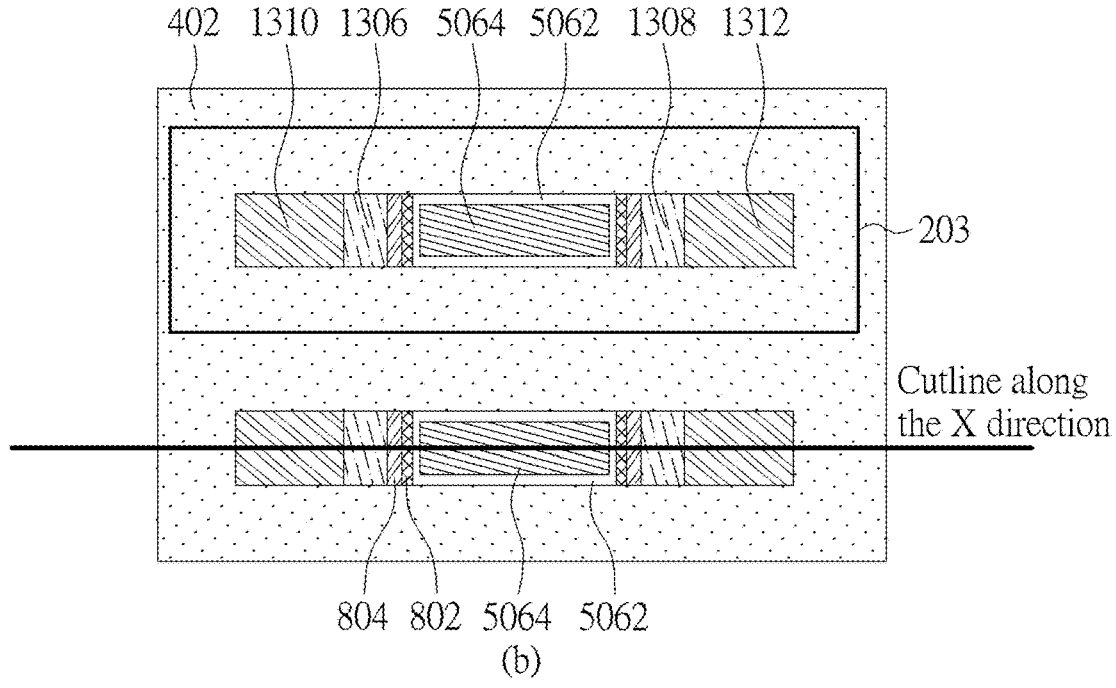
Figure 14:
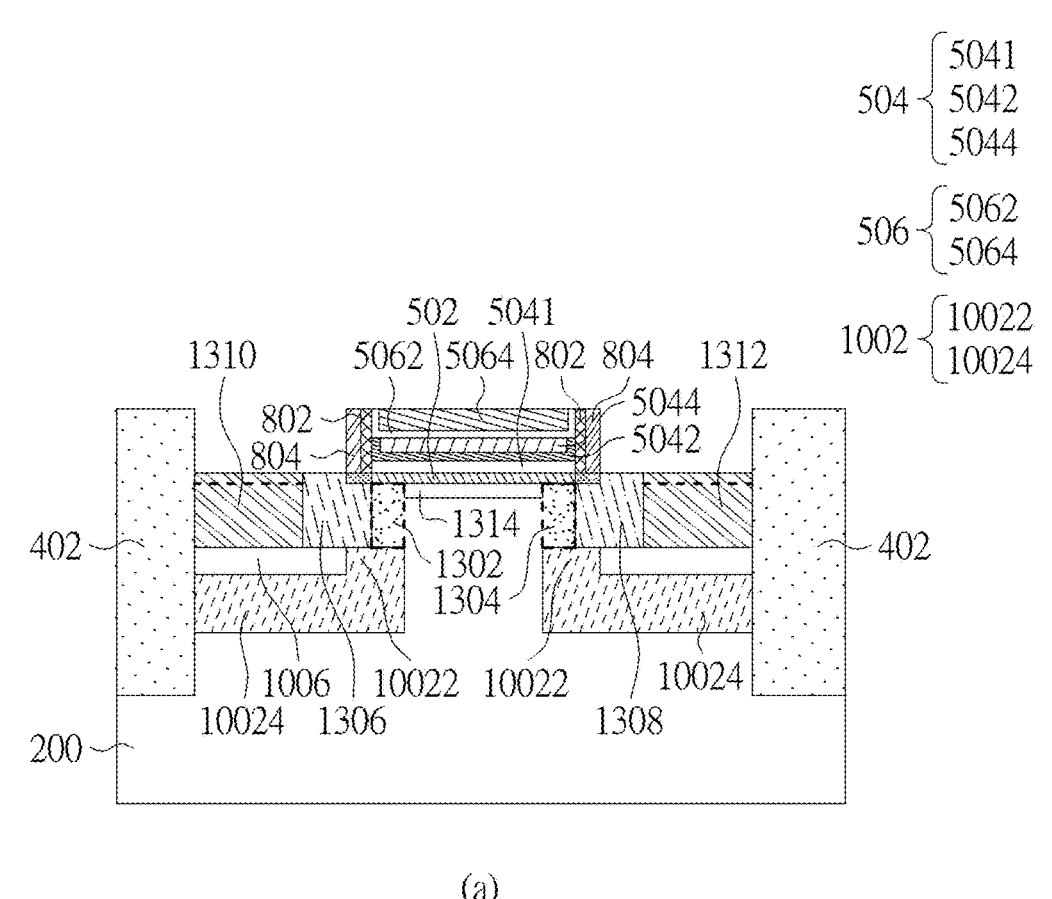
FIG. 14 is a diagram illustrating the NLDDS being still aligned with the edges of the gate region during the thermal annealing process.
Figure 14:
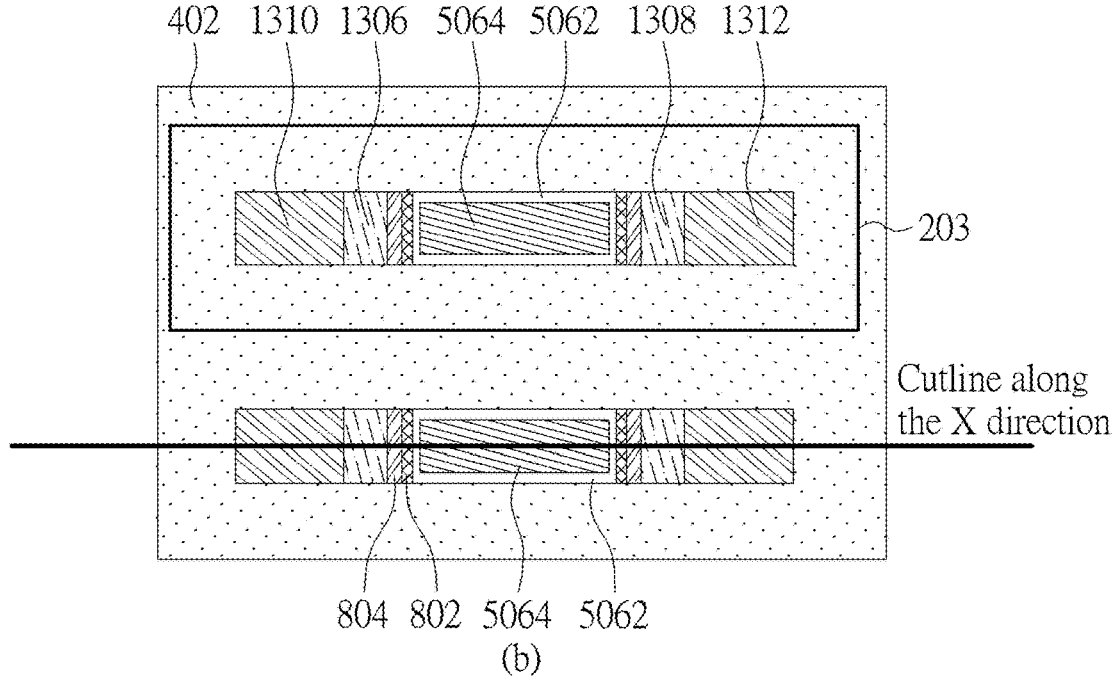
Figure 15:
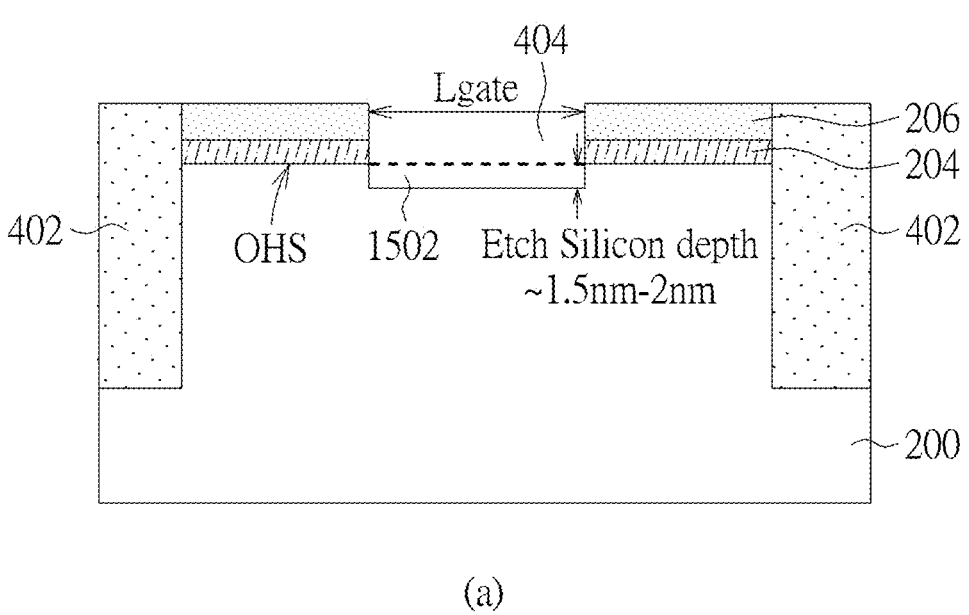
FIG. 15 is a diagram illustrating the channel region formed by ion-implantation according to another embodiment of the present invention.

Based on FIG. 12(*a*), as shown in FIG. 13(*a*), perform the processes introduced in FIG. 10 to reveal the exposed silicon surface with the sharp crystalline orientation (110), and then use a selective growth (such as selective epitaxy growth, SEG) technique to grow the silicon regions. In this embodiment of the present invention, the silicon regions include p-type regions (or called p-type vertical screening layers) 1302, 1304, n– lightly doped drains (NLDDs) 1306, 1308, n+ doped source region 1310, and n+ doped drain region 1312 of the NMOS transistor, wherein the source region includes the NLDD 1306 and the n+ doped source region 1310 and the drain region includes the NLDD 1308 and the n+ doped drain region 1312. In addition, each of the p-type regions 1302, 1304 is just like a regrown silicon body to compensate the loss of the silicon substrate during the formation of the oxide-3V layers 10022. Similarly, for the PMOS transistor, an n-vertical screening layer will be grown to play the same role as the p-type vertical screening layer in the NMOS transistor. As shown in FIG. 14, after thermal annealing, even there is lateral diffusion of the NLDDS 1306, 1308, the p-type regions 1302, 1304 could effectively screen or block the lateral diffusion of the NLDDS 1306, 1308, such that the edges of the diffused NLDDS 1306, 1308 are aligned with or substantially aligned with the edges of the gate region.

In addition, the doping concentration of the p-type regions 1302, 1304 could be the same as or similar to that of the channel region 1314 (or that of the p-type substrate 200). In addition, as shown in FIG. 14, the channel region 1314 could be formed underneath and close to the OHS through ion-implantation (not shown) before the formation of the gate region.

However, besides the channel region 1314 formed by ion-implantation, in another embodiment of the present invention, a channel region could be formed by selective growth. Please refer to FIG. 15(*a*). For example, before forming the gate dielectric material 502 in the concave 404, the revealed OHS in the concave 404 could be etched down to form a shallow trench 1502 with a depth of a few nm (e.g. 1.5 nm-2 nm). In addition, FIG. 15(*b*) is a top view corresponding to FIG. 15(*a*), wherein FIG. 15(*a*) is a cross-section view along a cutline of an X direction shown in FIG. 15(*b*).

Figure 16:
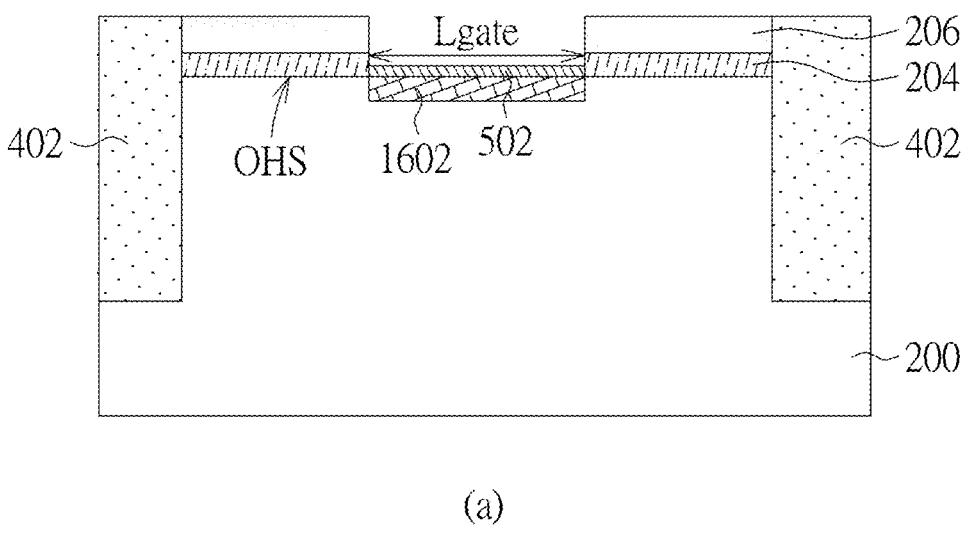
FIG. 16 is a diagram illustrating the channel region being selectively grown in the shallow trench and the gate dielectric material being formed on the channel region.
Figure 16:
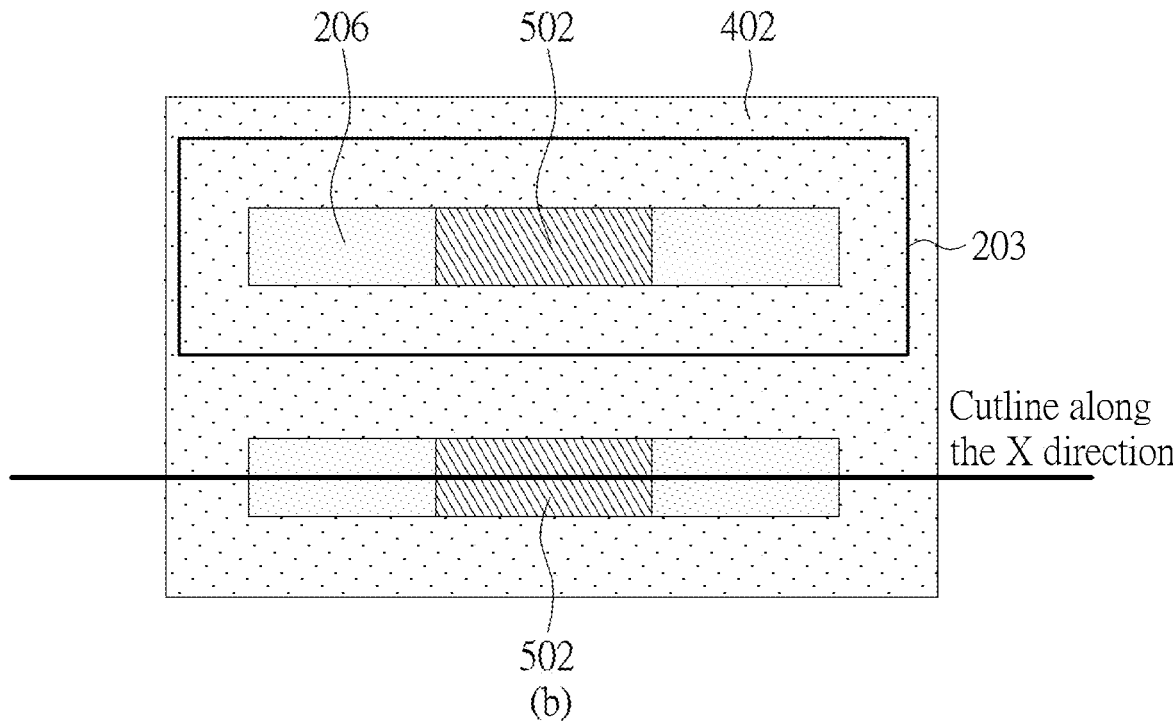

Then, as shown in FIG. 16(*a*), a channel region 1602 is selectively grown in the shallow trench 1502 and the gate dielectric material 502 is formed on the channel region 1602. In addition, FIG. 16(*b*) is a top view corresponding to FIG. 16(*a*), wherein FIG. 16(*a*) is a cross-section view along a cutline of an X direction shown in FIG. 16(*b*). Thereafter, the processes to form the gate region, the source region, and the drain region shown in FIGS. 6, 7, 8, 9, 10, 11, 12, 13, 14 could be similarly applied to form another planar NMOS transistor (or another planar PMOS transistor).

In addition, please refer to FIG. 14 again. As shown in FIG. 14, with the help of the p-type regions 1302, 1304, even there is any lateral diffusion of the NLDDS 1306, 1308 incurred from the thermal annealing process, the edges of the diffused NLDDS 1306, 1308 could still be aligned with or substantially aligned with the edges of the gate region. In other word, the P-N junction between the diffused p-type regions 1302, 1304 and the diffused source/drain regions could be aligned with the edges of the gate region. In addition, since the doping concentration of the p-type regions 1302, 1304 could be the same as or similar to that of the channel region 1314, the effective channel length of the NMOS transistor is still close to the length Lgate of the gate region. It is noticed that such P-N junction extending upward and the edge of the P-N junction is located on the LISS, such as on the oxide-3V layers 10022. Moreover, the p-type regions 1302, 1304 could effectively block the extension of the depletion region from the drain region to the source region, thus to reduce the possibility of punch through effect.

Figure 17:
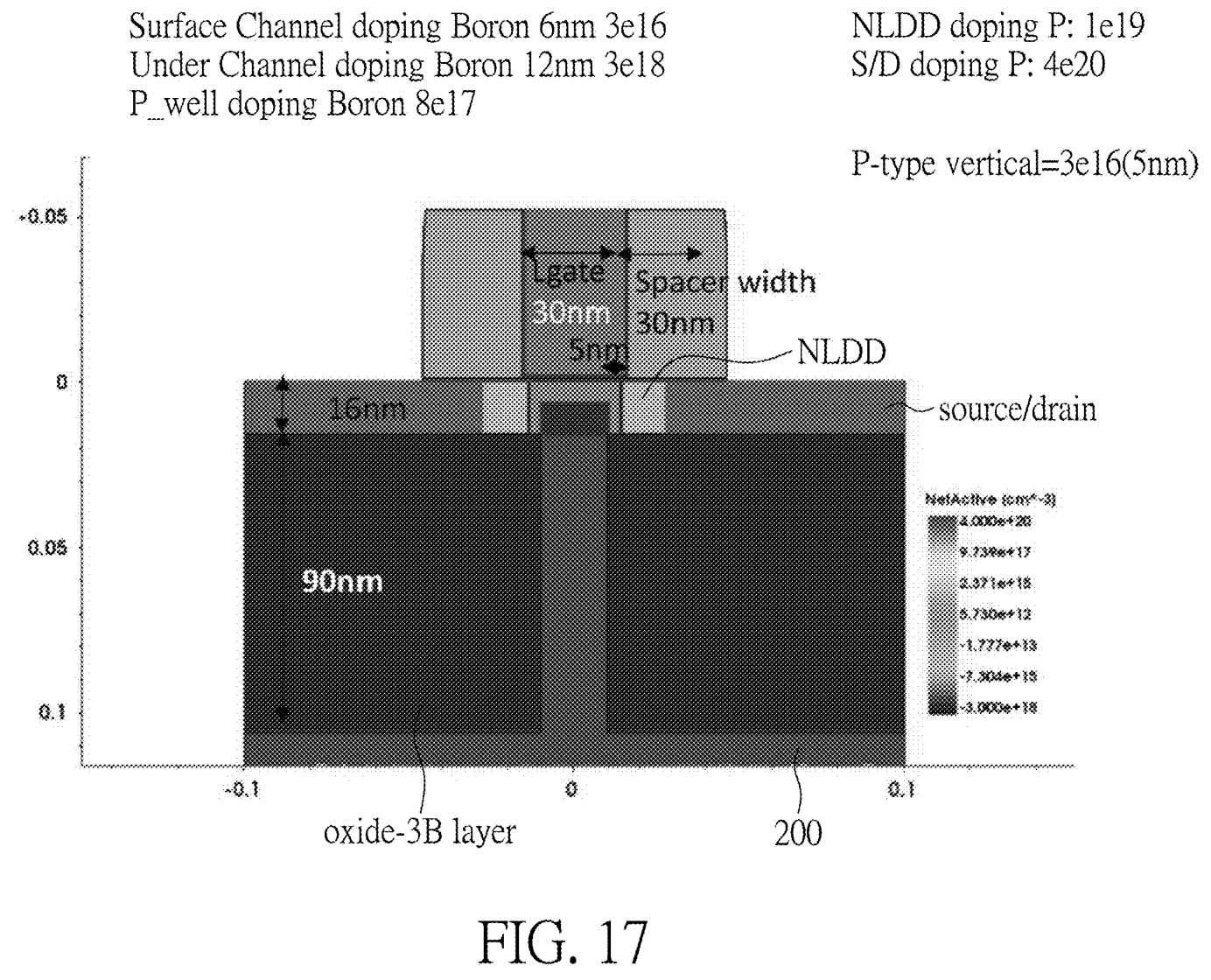
Figure 18:
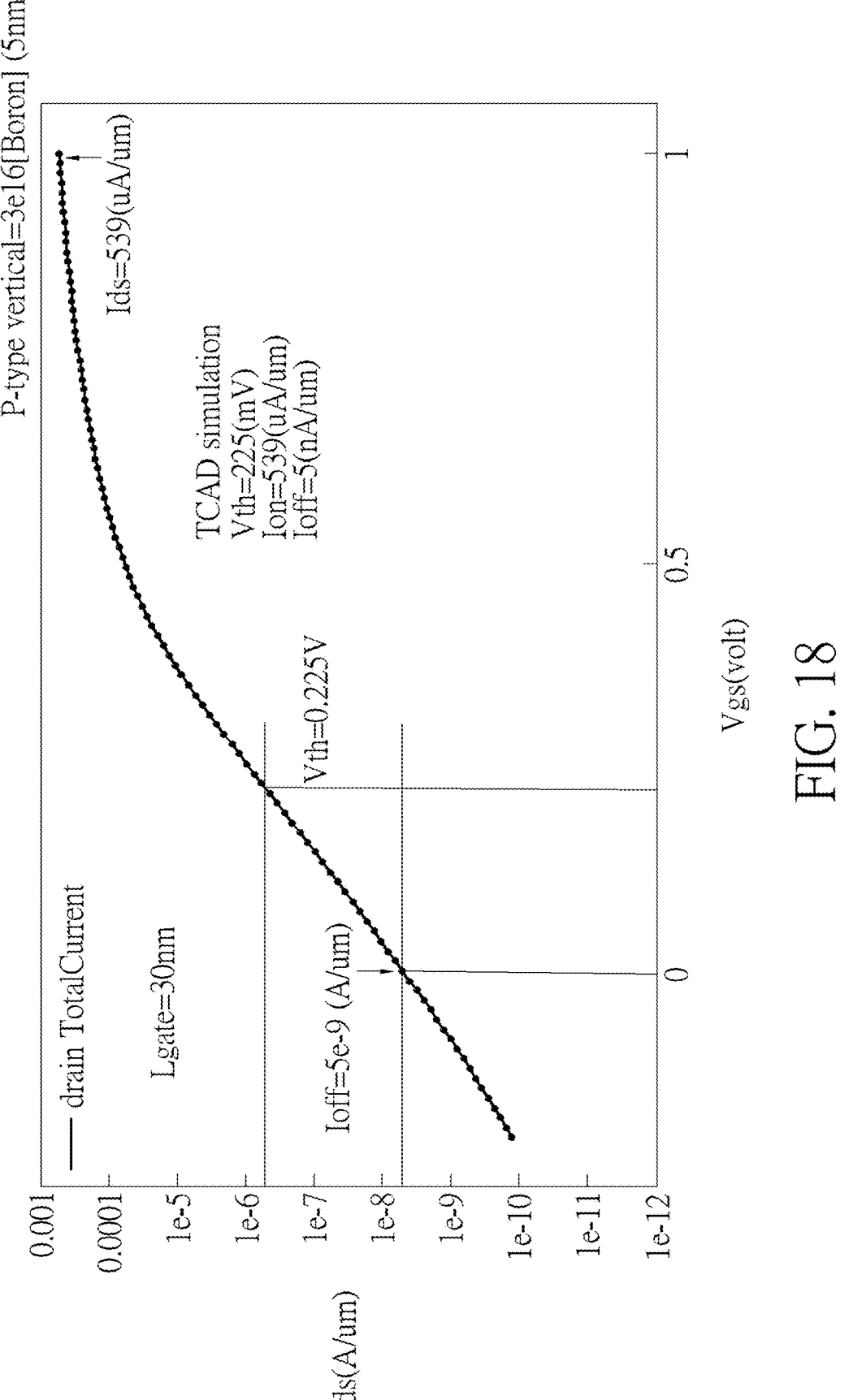
FIG. 18 is a diagram illustrating the Technology Computer-Aided Design (TCAD) simulation result of FIG. 17.

FIG. 17 shows the proposed planar NMOS transistor of the present invention with the p-type vertical screening layer, wherein the length of the gate region Lgate is 30 nm, the thickness of the oxide-3B layer is 90 nm, the distance between the edge of the oxide-3V layer and the edge of the gate region is 5 nm, the p-type vertical screening layer is doped with 3e16 and has lateral width of 5 nm, the surface channel region is doped with 3e16, the under channel region is doped with 3e18, the substrate is doped with 8e17, the n– LDD region is doped with 1e19 and the n+ doped region is doped with 4e20. As shown in FIG. 18 which is Technology Computer-Aided Design (TCAD) simulation result of Vgs-Ids curve for the planar NMOS transistor structure in FIG. 17, Vth of the proposed planar NMOS transistor is 225 mV, Ion is 539 uA/um and Ioff is 5 nA/um.

Figure 19:
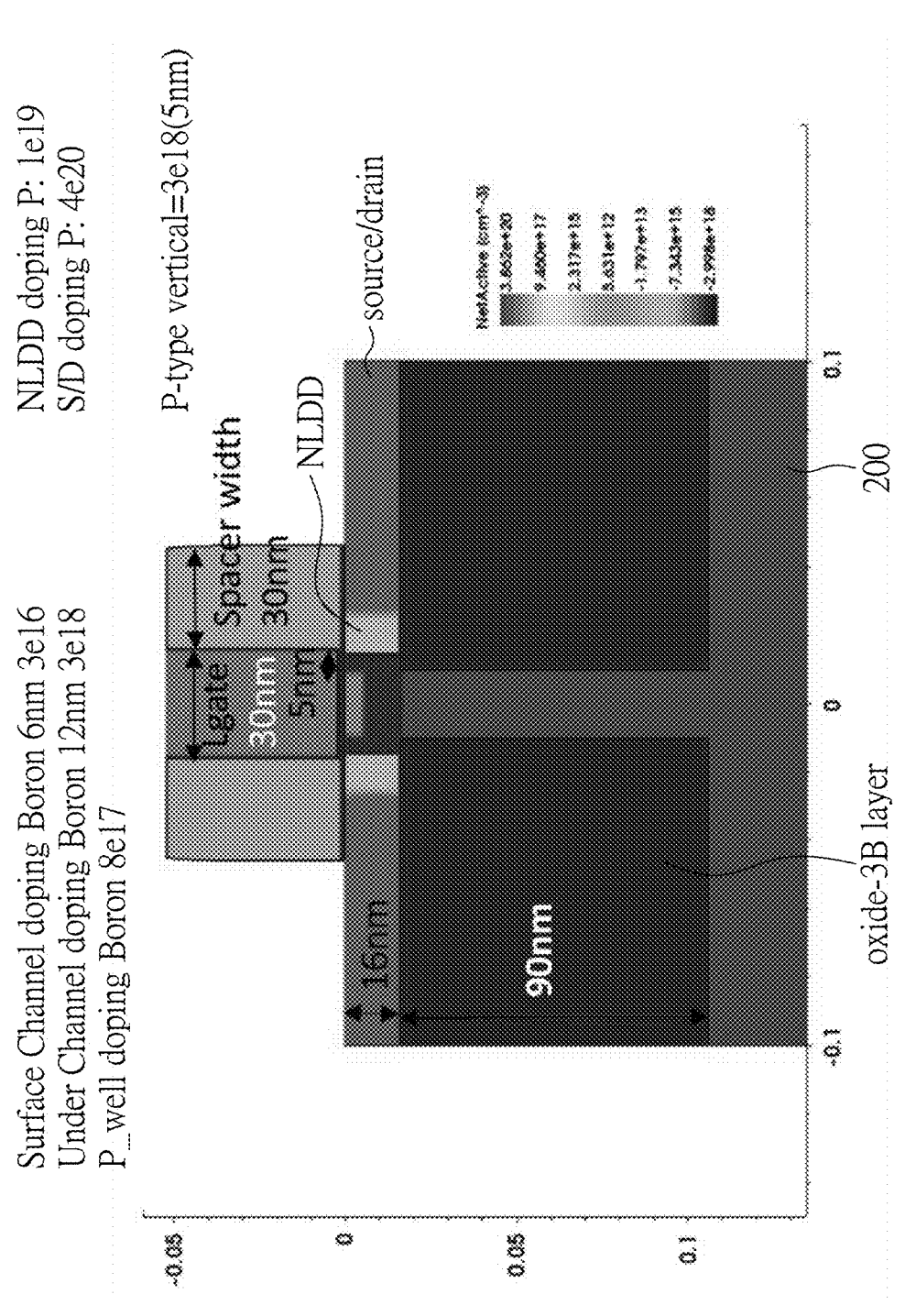
FIG. 19 is a diagram illustrating the another planar NMOS transistor according to the present invention.
Figure 20:
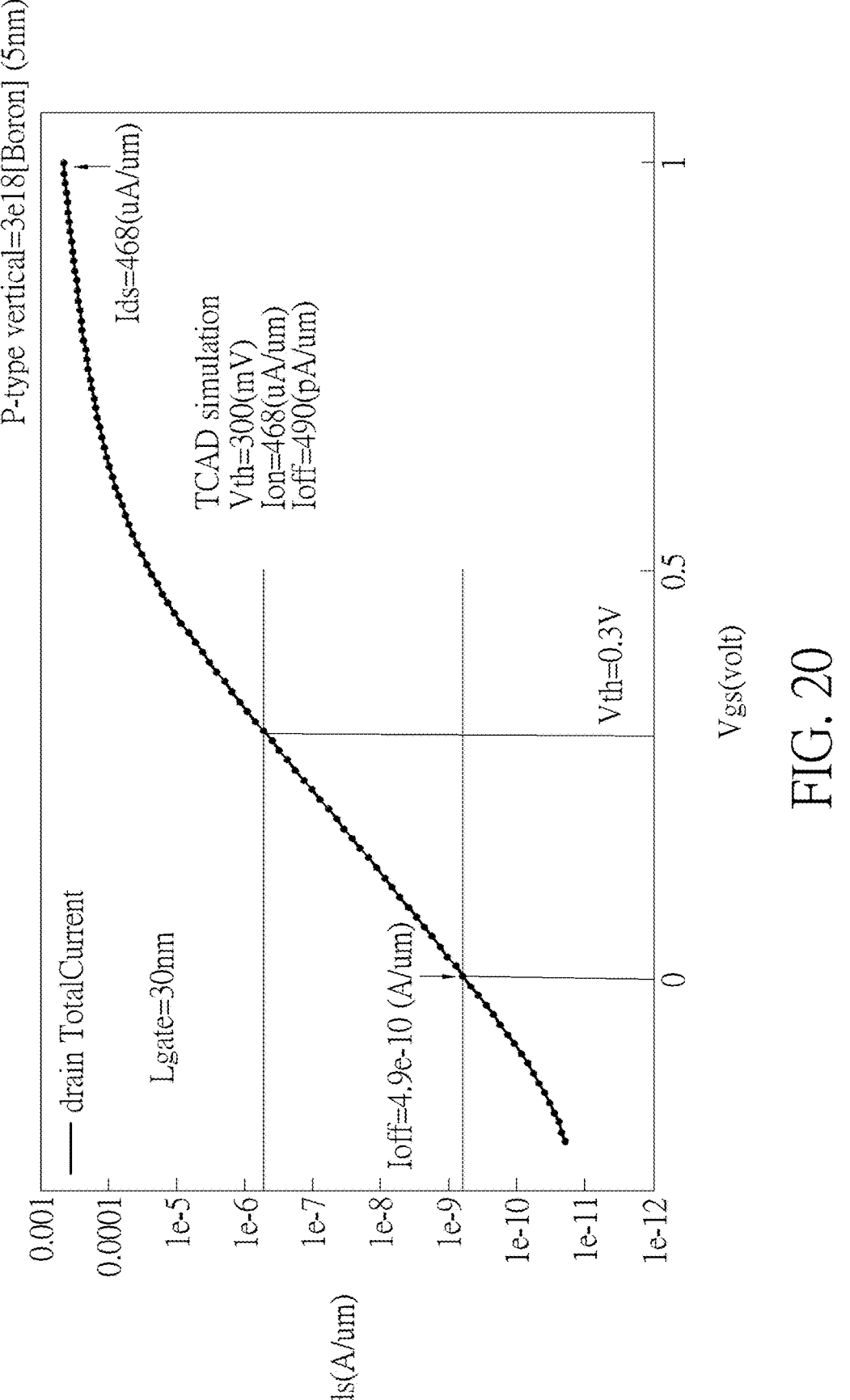
FIG. 20 is a diagram illustrating the TCAD simulation result of FIG. 19.

Furthermore, FIG. 19 shows another planar NMOS transistor according to the present invention, and the only difference between FIG. 19 and FIG. 17 is that in FIG. 19, the p-type vertical screening layer is doped with 3e18, the same as that of the under channel region. As shown in FIG. 20 which is TCAD simulation result of Vgs-Ids curve for the planar NMOS transistor in FIG. 19, Vth of the proposed planar NMOS transistor is 300 (mV), Ion is 468 (uA/um) and Ioff is 490 (pA/um). Compared with TCAD simulation result in FIG. 18, the higher doping concentration in p-type vertical screening layer, the higher Vth and lower Ioff.

The present invention has some novel results achieved:

(1) The new source/drain regions are formed by all (110) crystalline silicon; improving the conventional way of growing source/drain regions from two different seeding regions as explained causes lattice mixtures of (100) silicon and (110) silicon;

(2) The well-defined (110) crystalline of newly grown silicon structures is closely seamless and perfectly intact with the effective channel length, which gives exactly controlled size of transistor width;

(3) The newly grown silicon region can grow with in-situ doped dopants of either phosphorous/arsenic atoms for NMOS transistor or boron atoms for PMOS transistor. With such an in-situ doping silicon-growth technique the source/drain regions can be well designed to have LDD structures for controllable lateral distances and then be changed to heavily doped source/drain regions;

(4) Since there is no need to use ion-implantation to form LDD so that there is no need to use thermal Annealing process to reduce defects. Therefore, as no extra defects are generated once which were induced and hard to totally eliminate even by Annealing process any unexpected leakage current sources should be significantly minimized;

(5) Only (110) lattice structure must be handled along the channel-to-source/drain regions in contrast to that the conventional way of forming such conduction channels must handle a mixture of (110) and (100) lattice structures. So it is expected that newly grown silicon region outgrowth from both transistors body and channel region with precisely controllable SEG should create better high quality/high-performance source/drain-to-channel conduction mechanism. The sub-threshold leakage should be reduced. The channel conduction performance should be enhanced since the conduction mechanism from channel-through LDD to heavily-doped source/drain regions can thus have a holistic design even including some stressed-channel-mobility-enhancement technique by inserting foreign atoms/ions uniformly into source/drain regions could have synergistic effects for enhancing On-conduction performance;

(6) Another big advantage is that since the vertical boundary between the edge of gate region and the edge of the newly grown silicon region can be well defined based on thermal-oxidation controllability, the GIDL effect should be reduced in contrast to the conventional way of using LDD implantation to serve as the alignment of gate-edge to LDD;

(7) Since most the source/drain regions are isolated by insulation materials including the bottom structure of LISS, the junction leakage possibility can only happen to very small areas of the newly grown silicon region to channel regions and thus be significantly reduced;

(8) The p-type vertical screening layer not only compensates the loss of the silicon substrate during the formation of the oxide-3V layer thus to maintain the suitable length of the channel region, but also blocks the extension of the depletion region thus to reduce the possibility of punch through effect.

As such a newly grown silicon region is formed as described and shown in the aforementioned text, the remaining transistor formation steps can be continued to fill the entire source/drain regions with well-designed doping concentration profiles as desired. Another way of complete the active portions of source/drain regions is that, some Tungsten (or other suitable metal materials) plugs can be formed in a horizontal connection to the silicon portion of source/drain regions for completion of the entire source/drain regions. That is, some Tungsten (or other suitable metal materials) plug is located in the trenches 902 and 904 to contact the sidewalls of the n+ doped source region 1310, and n+ doped drain region 1312, and other Tungsten (or other suitable metal materials) plug is located above the trenches 902 and 904 to contact the top surfaces of the n+ doped source region 1310, and n+ doped drain region 1312. The active channel current flowing to future metal interconnection such as metal-1 layer is gone through LDD and heavily-doped conductive silicon source/drain regions to Tungsten (or other metal materials) which is directly connected to metal-1 by some good metal-to-metal ohmic contact with much lower resistance than the traditional silicon-to-metal contact.

To sum up, the MOSFET provided by the present invention has some advantages described as follows:

A. On Transistor Channel Conduction:

(a) Since active electrodes of source/drain regions are outgrown directly from crystalline planes of both transistor channel and body regions, their interfaces are formed seamless with the same (110) lattice orientation so that the channel width is precisely controlled; (b) since the plane of LDD is outgrown horizontally from both transistor channel and body with in-situ doping technique during the selective epitaxy growth (SEG), there is no ion-implantation process which can only be formed from the top silicon downward into the source/drain regions and no thermal annealing process which can make junction boundaries hard to be defined and controlled; (c) instead, the new invention can more precisely define the boundary edge of source/drain regions to the edge of gate region for minimizing SCE, GIDL and junction leakage currents.

B. On Source/Drain Regions Formation:

(a) There are insulated layers surrounding the source/drain regions (e.g. oxide-3V, oxide-3B, and the LISS) except the silicon openings facing transistor channel. Moreover, the depth of the source/drain region is controlled by the LISS. (b) Horizontal SEG formation of Silicon electrodes with LDD to heavily doped regions even including various non-silicon dopants such as Germanium or Carbon atoms to increase stresses to enhance channel mobility. (c) Furthermore, metal plugs are proposed to fill the vacancies of semiconductor regions to complete the entire source/drain regions above the LISS. (d) Moreover, the doping concentration profile is controllable or adjustable in the horizontal SEG/ALD formation of source/drain regions according to the present invention, especially a p-type vertical screening layer is first grown before the n-LDD region in the planar NMOS transistor (or an n-vertical screening layer first grown before the P-LDD region in the planar PMOS transistor). The p-type vertical screening layer not only compensates the loss of the silicon substrate during the formation of the oxide-3V layer thus to maintain the suitable length of the channel region, but also blocks the extension of the depletion region thus to reduce the possibility of punch through effect.

Of course, the present invention not only could be implemented in the planar MOSFET, but also be implemented in non-planar MOSFET, such as FinFET, Tri-gate, GAA (gate-All-Around) transistors.

Although the present invention has been illustrated and described with reference to the embodiments, it is to be understood that the invention is not to be limited to the disclosed embodiments, but on the contrary, is intended to cover various modifications and equivalent arrangements included within the spirit and scope of the appended claims.

What is claimed is:

1. A MOSFET (metal-oxide-semiconductor field-effect transistor) structure, comprising:
   a semiconductor substrate with a semiconductor surface;
   a gate structure above the semiconductor surface;
   a channel region being under the gate structure;
   a trench formed below the semiconductor surface and adjacent to the channel region;
   an isolation region in the trench;
   a first conductive region with a first doping type, the first conductive region being positioned on the isolating layer and electrically coupled to the channel region;
   a P-N junction extending upward from the isolation region and along an edge of the first conductive region; and
   a vertical screening layer contacting with the first conductive region, wherein a doping type of the vertical screening layer is different from the first doping type of the first conductive region.

2. The MOSFET structure in claim 1, wherein a doping type of the vertical screening layer is the same as that of the semiconductor substrate.

3. The MOSFET structure in claim 2, wherein both the first conductive region and the vertical screening layer comprise epitaxial layer, and the P-N junction is between the first conductive region and the vertical screening layer.

4. The MOSFET structure in claim 3, wherein the MOSFET structure is a planar n-type metal-oxide-semiconductor (NMOS) transistor, the vertical screening layer is a p-type vertical screening layer, the first conductive region comprises an n-type lightly doped drain (LDD) region contacting with the p-type vertical screening layer and an n-type heavily doped region contacting with the n-type lightly doped drain (LDD) region.

5. The MOSFET structure in claim 4, wherein the doping concentration of the vertical screening layer is the same or substantially the same as that of the channel region.

6. The MOSFET structure in claim 4, wherein an edge of the n-type lightly doped drain (LDD) region is aligned or substantially aligned with an edge of the gate structure.

7. The MOSFET structure in claim 4, wherein the first conductive region comprises a metal containing region, and the metal containing region is positioned in the trench and abuts against the n-type heavily doped region.

8. A MOSFET (metal-oxide-semiconductor field-effect transistor) structure, comprising:
   a semiconductor substrate with a semiconductor surface;
   a gate structure above the semiconductor surface;
   a channel region being under the gate structure;
   a trench formed below the semiconductor surface and adjacent to the channel region;
   an isolation region in the trench, wherein the isolation region comprises:
      a vertical oxide layer covering a sidewall of the trench and a horizontal oxide layer covering a bottom wall of the trench; and
      an insulation plug in the trench and on the horizontal oxide layer;
   a first conductive region with a first doping type, the first conductive region being positioned on the isolating layer and electrically coupled to the channel region; and
   a P-N junction extending upward from the isolation region and along an edge of the first conductive region.

9. The MOSFET structure in claim 8, wherein an edge of the vertical oxide layer is underneath the gate structure, and a distance between the edge of the vertical oxide layer and an edge of the gate structure is $\frac{1}{10} \sim \frac{1}{4}$ of a length of the gate structure.

10. The MOSFET structure in claim 8, further comprising a shallow trench isolation region surrounding sidewalls of the first conductive region, and a bottom wall of the first conductive region is isolated from the semiconductor substrate by the isolation region.

11. A MOSFET structure, comprising:
   a semiconductor substrate with a semiconductor surface;
   a first trench and a second trench formed below the semiconductor surface;
   a first isolation region in the first trench and a second isolation region in the second trench;
   a gate structure above the semiconductor surface, the gate structure comprising a gate isolation layer above the semiconductor surface, and a gate conductive layer above the gate isolation layer;
   a channel region being under the gate structure;
   a drain region with a first doping type on the first isolation region;
   a source region with the first doping type on the second isolation region; and a first vertical screening layer contacting with the drain region, wherein a doping type of the first vertical screening layer is different from the first doping type of the drain region;

wherein a distance between an edge of the first isolation region and an edge of the second isolation region is smaller than a length of the gate structure.

12. The MOSFET structure in claim 11, wherein the distance between the edge of the first isolation region and the edge of the second isolation region is ½~⅘ of the length of the gate structure.

13. The MOSFET structure in claim 11, wherein a doping type of the vertical screening layer is the same as that of the semiconductor substrate.

14. The MOSFET structure in claim 13, wherein the doping concentration of the first vertical screening layer is the same or substantially the same as that of the channel region.

15. The MOSFET structure in claim 13, wherein a P-N junction is between the first vertical screening layer and the drain region, and the P-N junction extends upward from the first isolation region, and is aligned or substantially aligned with an edge of the gate structure.

16. The MOSFET structure in claim 13, wherein the channel region, the first vertical screening layer and the drain region comprise epitaxial layer.

17. A MOSFET structure surrounded by a shallow trench isolation region, comprising:

a semiconductor substrate with a semiconductor surface;

a first trench and a second trench formed below the semiconductor surface;

a first isolation region in the first trench and a second isolation region in the second trench;

a gate structure above the semiconductor surface;

a channel region under the gate structure;

a drain region with a first doping type on the first isolation region;

a source region with the first doping type on the second isolation region; and a first vertical screening layer between the drain region and the channel region, wherein a doping type of the first vertical screening layer is different from the first doping type of the drain region, and the first vertical screening layer and the drain region comprise epitaxial layer.

18. The MOSFET structure in claim 17, wherein a horizontal thickness of the first vertical screening layer is 2~5 nm.

19. The MOSFET structure in claim 17, wherein three sidewalls of the drain region is isolated from the semiconductor substrate by the shallow trench isolation region, and a bottom wall of the first conductive region is isolated from the semiconductor substrate by the first isolation region.

20. The MOSFET structure in claim 17, wherein the planar MOSFET structure is formed by a technology node 2, and a length of the gate structure is between $1.2\lambda$~$2.4\lambda$ when $\lambda$ is between 12 nm~30 nm.

* * * * *